United States Patent
Wei et al.

(10) Patent No.: US 12,409,529 B2
(45) Date of Patent: Sep. 9, 2025

(54) VACUUM ASSEMBLY FOR CHEMICAL MECHANICAL POLISHING

(71) Applicant: Taiwan Semiconductor Manufacturing Co., Ltd., Hsinchu (TW)

(72) Inventors: Yu-Chen Wei, New Taipei (TW); Chih-Yuan Yang, Hsinchu (TW); Shih-Ho Lin, Jhubei (TW); Jen Chieh Lai, Tainan (TW); Szu-Cheng Wang, Tainan (TW); Chun-Jui Chu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 887 days.

(21) Appl. No.: 17/097,668

(22) Filed: Nov. 13, 2020

(65) Prior Publication Data
US 2021/0060728 A1   Mar. 4, 2021

Related U.S. Application Data

(62) Division of application No. 16/185,723, filed on Nov. 9, 2018, now Pat. No. 10,843,307.
(Continued)

(51) Int. Cl.
*B24B 53/017*   (2012.01)
*B24B 1/00*   (2006.01)
(Continued)

(52) U.S. Cl.
CPC .............. *B24B 53/017* (2013.01); *B24B 1/00* (2013.01); *B24B 37/044* (2013.01); *B24B 53/00* (2013.01);
(Continued)

(58) Field of Classification Search
None
See application file for complete search history.

(56) References Cited

U.S. PATENT DOCUMENTS 5,885,137 A * 3/1999 Ploessl .................. B24B 53/017
451/443
5,916,010 A * 6/1999 Varian .................... B24B 53/017
451/72
(Continued)

FOREIGN PATENT DOCUMENTS

CN    101817162 A    9/2010
CN    202053164 U    11/2011
(Continued)

*Primary Examiner* — Karla A Moore
(74) *Attorney, Agent, or Firm* — Slater Matsil, LLP

(57) ABSTRACT

A method includes depositing a slurry onto a polishing pad of a chemical mechanical polishing (CMP) station. A workpiece is polished and polishing by-products and slurry are removed from the polishing pad by a vacuum head. A CMP apparatus includes a polishing pad configured to rotate during a CMP process. The apparatus also includes a slurry dispenser configured to deposit a slurry onto a polishing surface of the polishing pad. The apparatus further includes a momentum vacuum assembly including a slotted opening facing the polishing surface of the polishing pad. The apparatus also includes a first suction line coupled to an upper portion of the momentum vacuum assembly and leading to a first vacuum source, the first suction line configured to transport polishing products which have been removed from the polishing pad through the slotted opening.

20 Claims, 17 Drawing Sheets

Related U.S. Application Data

(60) Provisional application No. 62/737,997, filed on Sep. 28, 2018.

(51) Int. Cl.
    *B24B 37/04* (2012.01)
    *B24B 53/00* (2006.01)
    *B24B 53/06* (2006.01)
    *H01L 21/306* (2006.01)
    *H01L 21/321* (2006.01)
    *H01L 21/67* (2006.01)

(52) U.S. Cl.
    CPC ........ *B24B 53/06* (2013.01); *H01L 21/30625* (2013.01); *H01L 21/3212* (2013.01); *H01L 21/67023* (2013.01)

(56) References Cited

U.S. PATENT DOCUMENTS

| | | | |
|---|---|---|---|
| 6,110,011 A * | 8/2000 | Somekh | H01L 21/67167 |
| | | | 257/E21.585 |
| 6,190,236 B1 * | 2/2001 | Drill | B24B 53/017 |
| | | | 451/41 |
| 6,508,697 B1 * | 1/2003 | Benner | B24B 53/095 |
| | | | 451/285 |
| 6,626,743 B1 * | 9/2003 | Boyd | B24B 21/04 |
| | | | 451/299 |
| 7,040,967 B2 | 5/2006 | Benner | |
| 7,258,600 B1 | 8/2007 | Benner | |
| 8,277,286 B2 * | 10/2012 | Hung | B24B 57/02 |
| | | | 451/60 |
| 9,511,475 B2 | 12/2016 | Chen et al. | |
| 10,843,307 B2 * | 11/2020 | Wei | B24B 37/044 |
| 2003/0013381 A1 | 1/2003 | Benner et al. | |
| 2006/0234503 A1 * | 10/2006 | Yamada | B08B 3/02 |
| | | | 257/E21.228 |
| 2007/0087672 A1 * | 4/2007 | Benner | B24B 57/00 |
| | | | 451/285 |
| 2015/0314417 A1 * | 11/2015 | Sun | B24B 53/007 |
| | | | 451/443 |
| 2016/0016283 A1 * | 1/2016 | Butterfield | B24B 53/017 |
| | | | 156/345.12 |
| 2024/0383100 A1 * | 11/2024 | Wei | H01L 21/67219 |

FOREIGN PATENT DOCUMENTS

| | | |
|---|---|---|
| CN | 102806525 A | 12/2012 |
| JP | 2000237949 A | 9/2000 |
| JP | 2006245410 A | 9/2006 |
| TW | M528231 U | 9/2016 |

\* cited by examiner

VACUUM ASSEMBLY FOR CHEMICAL MECHANICAL POLISHING

PRIORITY CLAIM AND CROSS REFERENCE

This application is a divisional of application Ser. No. 16/185,723, filed on Nov. 9, 2018, which claims the benefit of U.S. Provisional Application No. 62/737,997 filed on Sep. 28, 2018, entitled "Vacuum Assembly for Chemical Mechanical Polishing," which application is hereby incorporated herein by reference.

BACKGROUND

Generally, semiconductor devices comprise active components (e.g., transistors) formed on a substrate. Any number of interconnect layers may be formed over the substrate connecting active components to each other and to other devices. The interconnect layers may be fabricated from low-k dielectric material layers with metallic trenches/vias disposed therein. As the layers and other features of a device are formed, the device is sometimes planarized. For example, the formation of metallic features in a substrate or in a metal layer may cause uneven surface topography. This uneven topography can cause problems with formation of subsequent layers. In some cases, uneven topography may interfere with subsequent photolithographic processes used to form various features in a device. Therefore, it may be desirable to planarize a surface of a device after various features or layers are formed.

A commonly-used method of planarization is chemical mechanical polishing (CMP). Typically, CMP involves placing a wafer in a carrier head, where the wafer is held in place by a retaining ring. The carrier head and the wafer are then rotated as downward pressure is applied to the wafer against a polishing pad. A chemical solution, referred to as a slurry, is deposited onto the surface of the polishing pad to aid planarization. The surface of the wafer may be planarized using a combination of mechanical and chemical mechanisms.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
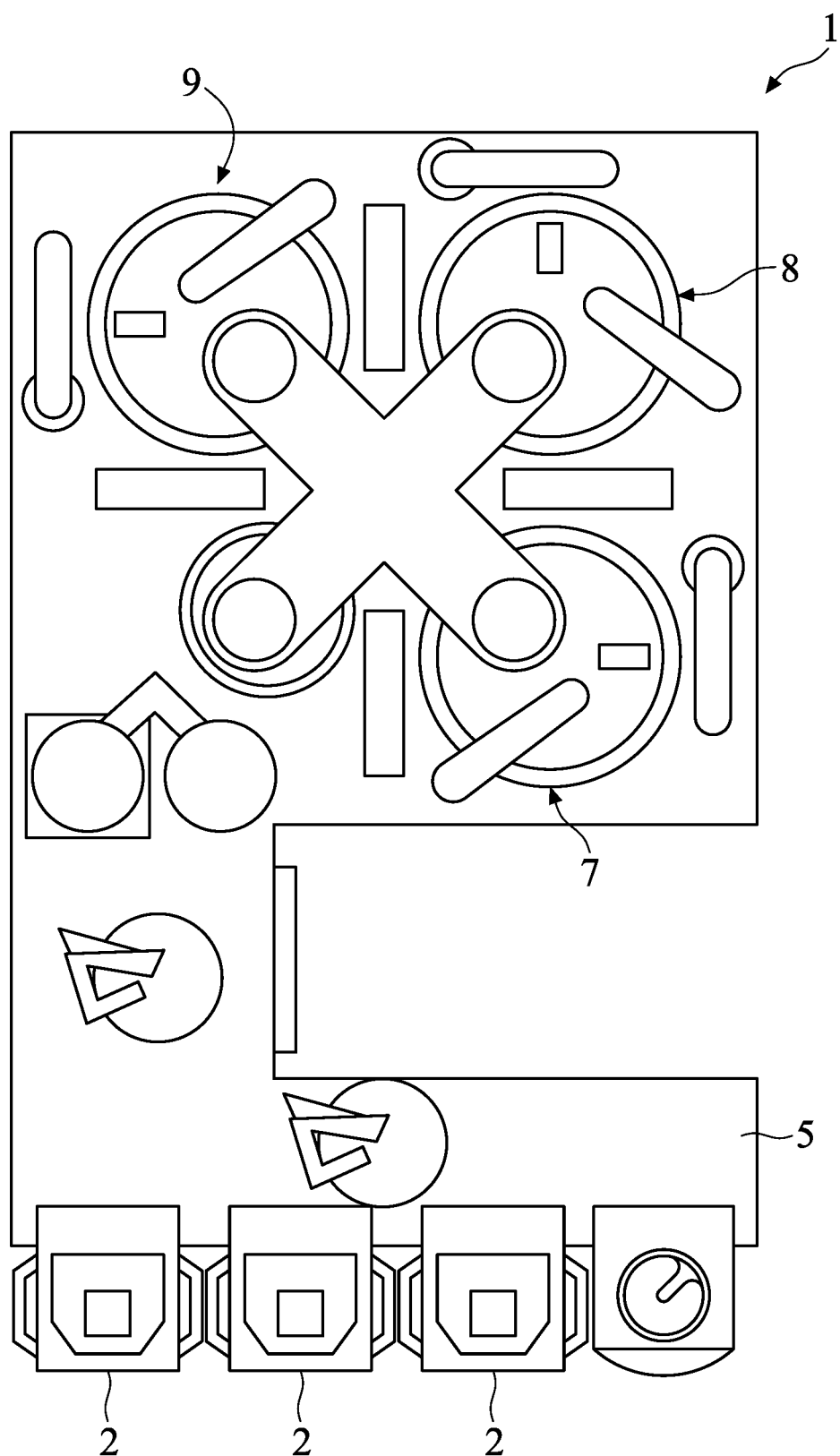
FIG. 1 illustrates a CMP system which may be used to planarize a device in a step of a fabrication process, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A CMP process is used to remove materials from a workpiece, such as in planarization of a wafer. Removal rate of the CMP process can be improved and inline defects resulting from the CMP process can be eliminated or reduced by embodiment processes which remove debris and polishing by-products as well as excess abrasives from a polishing surface of a polishing pad of a CMP station during CMP processing. Removal of by-products and debris after a CMP process is important because these residues may lead to loading, dishing, or surface defects in localized pattern regions. These residues may also induce a removal rate change, causing inconsistent results across different workpieces or processing steps, due to insufficient abrasive utilization. Typically, residue removal may occur by use of a pad conditioner/dresser apparatus including a diamond disk to dress the polishing pad and dislodge residue. However, the dressing down force or robot controlling mechanisms may be shifted or broken during continuous polish, leading to poor debris removal. Embodiment processes resolve these issues by providing a vacuum system which is moved over the polishing surface of the polishing pad of a CMP station, thereby removing excess debris and polishing by-products and excess abrasives. The vacuum system may also aid in the even distribution of slurry.

FIG. 1 illustrates a CMP system 1 which may be used to planarize a device in a step of a fabrication process, such as to remove excess conductive materials, insulating materials, and so forth from the surface of a workpiece, such as a wafer.

The CMP system 1 may include loadlocks 2, cleaning station 5, and one or more CMP station platens, such as a high-rate platen 7 and a buffing platen 8. The loadlocks 2 may be used for loading the workpiece into the CMP system 1, and then unloading the workpiece once the CMP process has been completed. High-rate platen 7 and buffing platen 8 are each an example of a CMP station 9 in the CMP system 1, which is used to perform workpiece polishing. The high-rate platen 7 may be used for polishing and removing the material with a relatively high polishing rate, such as a bulk polishing rate, while the buffing platen 8 may be used for polishing and removing material with a slower polishing rate and also to fix defects and scratches that may occur during the high-rate removal. Embodiments described herein may be used with the high-rate platen 7, buffing platen 8, and/or other platens. CMP system 1 includes other components which are not described, except as noted below with respect to embodiment CMP stations 9 within the CMP system 1. For example, the movement and control of various components of the CMP system 1 may be performed by robotic features including motors, controllers, and so forth.

Figure 2:
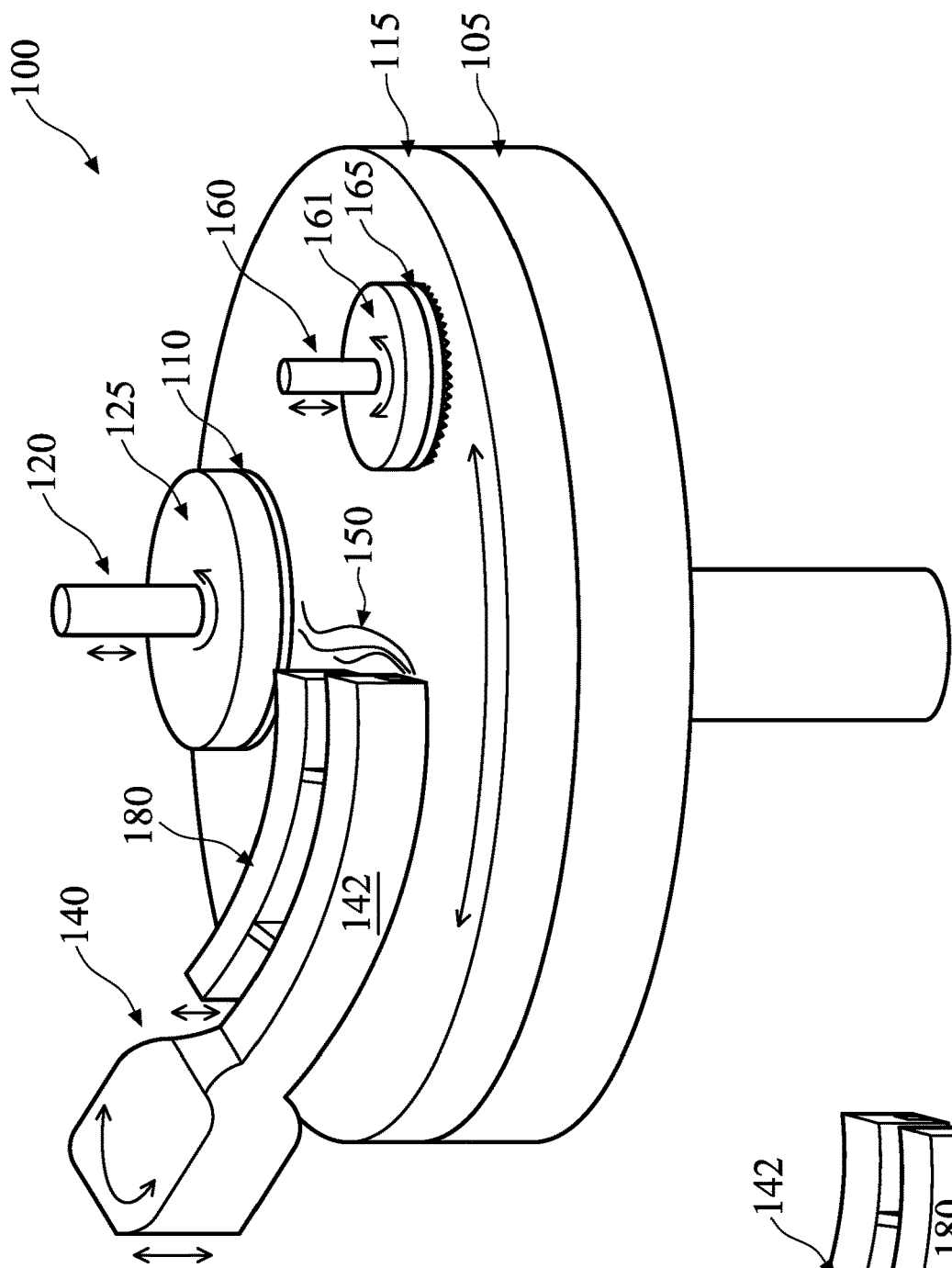
FIGS. 2 through 11 illustrate various aspects of a CMP station of a CMP system, in accordance with some embodiments.

FIGS. 2 through 11 illustrate various aspects of a CMP station of a CMP system, in accordance with some embodiments. FIG. 2 illustrates a three-quarter isometric view of a CMP station 100 in accordance with representative embodiments. In some embodiments, CMP station 100 includes a platen 105 over which a polishing pad 115 is placed. In some embodiments, polishing pad 115 may include a single layer or a composite layer of materials such as felts, polymer impregnated felts, microporous polymers films, microporous synthetic leathers, filled polymer films, unfilled textured polymer films, combinations of same, or the like. Representative polymers may include polyurethane, polyolefins, or the like.

In some embodiments, a polishing head 120 is positioned over polishing pad 115. The polishing head 120 includes a carrier 125. During a CMP process, a workpiece 110 (e.g., a semiconductor wafer) is placed within carrier 125. The workpiece 110 is placed in carrier 125 such that carrier 125 holds the workpiece 110 in position during a CMP process. The workpiece 110 is positioned such that a surface to be polished faces downward towards polishing pad 115. Carrier 125 may be moved up and down and is configured to apply a downward force or pressure to contact the workpiece 110 to the polishing pad 115. The polishing head 120 is configured to rotate the workpiece 110 against the polishing pad 115 during planarization/polishing.

In some embodiments, CMP station 100 includes a slurry dispenser 140 configured to deposit a slurry 150 onto polishing pad 115. The slurry dispenser 140 may have one or more slurry dispensing nozzles for dispensing slurry onto polishing pad 115. A slurry dispensing nozzle (see, e.g., FIG. 5), for example, may be located at the distal end of the slurry dispenser 140. In some embodiments one or more slurry dispensing nozzles (not shown) may also be located along an arm of the slurry dispenser 140 between the base end of the arm and the distal end of the arm. The slurry dispenser 140 may also include a cover 142 which covers the arm of the slurry dispenser 140 which transports slurry 150 to the one or more slurry dispensing nozzles. In some embodiments, the slurry dispenser 140 may be configured to move back and forth over the surface of polishing pad 115. In some embodiments, the slurry dispenser 140 may be configured to move up and down to adjust a vertical distance from the slurry dispenser 140 to the polishing pad 115.

Platen 105 is configured to rotate causing slurry 150 to be distributed between the workpiece 110 and polishing pad 115. Given compositions of slurry 150 depend on types of material to be polished or removed. For example, slurry 150 may comprise a reactant, an abrasive, a surfactant, and a solvent. The reactant may be a chemical, such as an oxidizer or a hydrolyzer, which will chemically react with a material of the workpiece in order to assist polishing pad 115 in abrading/removing material. In some embodiments in which material to be removed includes tungsten, the reactant may be, e.g., hydrogen peroxide; although any other suitable reactant, such as hydroxylamine, periodic acid, ammonium persulfate, other periodates, iodates, peroxomonosulfates, peroxymonosulfuric acid, perborates, malonamide, combinations of these, or the like, configured to aid in removal of material may be alternatively, conjunctively, or sequentially employed. Other reactants may be used to remove other types of materials. For example, in some embodiments in which a material to be removed includes an oxide, the reactant may comprise $HNO_3$, KOH, $NH_4OH$, combinations of same, or the like.

The abrasive may include any suitable particulate that, in conjunction with polishing pad 115, is configured to polish/planarize the workpiece 110. In some embodiments, the abrasive may include silica, aluminum oxide, cerium oxide, polycrystalline diamond, polymer particles (e.g., polymethacrylate, or the like), combinations of these, or the like.

A surfactant may be utilized to help disperse the reactant and abrasive within slurry 150, and to prevent (or otherwise reduce) abrasive from agglomerating during a CMP process. In some embodiments, the surfactant may include sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations of same, or the like. However, such representative embodiments are not intended to be limited to the recited surfactants, as any suitable surfactant may be alternatively, conjunctively, or sequentially employed.

A remaining portion of slurry 150 may include a solvent that may be utilized to combine reactant(s), abrasive(s), and surfactant(s), and allow the mixture to be moved and dispersed onto polishing pad 115. In some embodiments, a solvent of slurry 150 may include, e.g., deionized (DI) water or an alcohol; however, any other suitable solvent may be alternatively, conjunctively, or sequentially employed.

Figure 3:
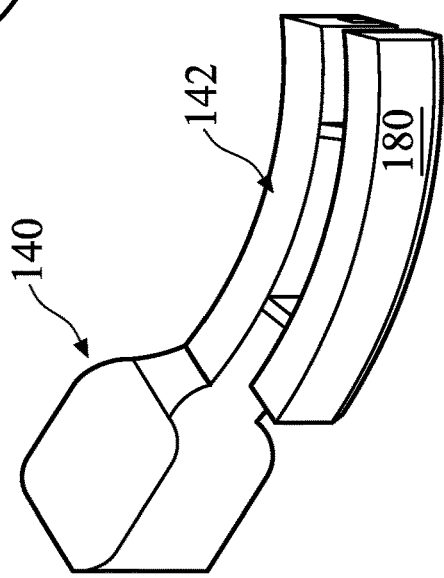

In some embodiments, CMP station 100 includes a momentum vacuum assembly 180 attached to one or more components of the CMP station 100 which includes a vacuum head as described in greater detail below. In some embodiments, momentum vacuum assembly 180 may be attached to the slurry dispenser 140 or a pad conditioning/dresser assembly (described below). Momentum vacuum assembly 180 may be attached using mechanical fasteners, e.g., screws or by any other suitable means. In some embodiments, momentum vacuum assembly 180 may be attached to the cover 142 of the slurry dispenser 140 or may attach to another part of the slurry dispenser 140. In some embodiments, momentum vacuum assembly 180 may be attached via a mechanism which is configured to allow the momentum vacuum assembly 180 to move up and down, to adjust a distance from an inlet (see, e.g., FIGS. 10 through 11) of the momentum vacuum assembly 180 to the polishing pad 115. In some embodiments, the momentum vacuum assembly 180 may be attached to the slurry dispenser 140 at a side of the slurry dispenser 140 which is closer to the polishing head 120. In other embodiments, such as illustrated in FIG. 3, momentum vacuum assembly 180 may be attached to the slurry dispenser 140 at a side of slurry dispenser 140 which is further from the polishing head 120. In yet other embodiments, a momentum vacuum assembly 180 may be attached to the slurry dispenser 140 on both sides of the slurry dispenser 140. Additional details regarding the momentum vacuum assembly 180 are provided in the discussion of FIGS. 3 through 11, below.

Still referring to FIG. 2, in some embodiments, CMP station 100 may include a dresser assembly 160 having pad conditioner disk 165 attached to a pad conditioner head 161. The dresser assembly 160 is configured to rotate pad conditioner head 161 and pad conditioner disk 165 over the polishing pad 115. In some embodiments, a pad conditioner disk 165 is mounted to the pad conditioner head 161 using mechanical fasteners, e.g., screws or by any other suitable means. A pad conditioner arm (see FIG. 4) of the dresser assembly 160 is attached to the pad conditioner head 161, and is configured to move the pad conditioner head 161 and the pad conditioner disk 165 in a sweeping motion across the surface of the polishing pad 115. In some embodiments, the pad conditioner head 161 is mounted to the pad conditioner arm (see FIG. 4) using mechanical fasteners, e.g., screws or by any other suitable means. In some embodiments, the pad conditioner disk 165 comprises a substrate over which an array of abrasive particles is bonded using, for example, electroplating. In some embodiments, the pad conditioner disk 165 comprises a diamond dresser disk.

The pad conditioner disk 165 helps remove built-up wafer debris and excess slurry from the polishing pad 115 during CMP processing by dislodging such debris and slurry from the polishing pad 115. In some embodiments, the pad conditioner disk 165 also acts as an abrasive for the polishing pad 115 to create a desired texture (such as, for example, grooves, or the like) against which the workpiece may be polished. In some embodiments, the pad conditioner disk 165 may contain openings to accommodate a vacuum head suction system (see, e.g., FIGS. 15 through 18) through the dresser assembly 160. Additional details regarding the pad conditioner disk 165 and the dresser assembly 160 are provided in the discussion of FIGS. 14 through 18, below.

As illustrated in FIG. 2, CMP station 100 may have a single polishing head (e.g., the polishing head 120) and a single polishing pad (e.g., polishing pad 115); however, in some embodiments, CMP station 100 may have multiple polishing heads and/or multiple polishing pads (see FIG. 1). In some embodiments in which the CMP station 100 has multiple polishing heads and a single polishing pad, multiple workpieces (e.g., semiconductor wafers) may be polished at a same time. In other embodiments in which the CMP station 100 has a single polishing head and multiple polishing pads, a CMP process may include multiple steps. A first polishing pad may be used for bulk material removal from a wafer (e.g., high-rate platen 7 of FIG. 1), a second polishing pad may be used for global planarization of the wafer, and a third polishing pad may be used to buff a surface of the wafer (e.g., the buffing platen 8 of FIG. 1). In some embodiments, different slurry compositions may be used for different CMP stages. In still other embodiments, a same slurry composition may be used for all CMP stages.

Figure 4:
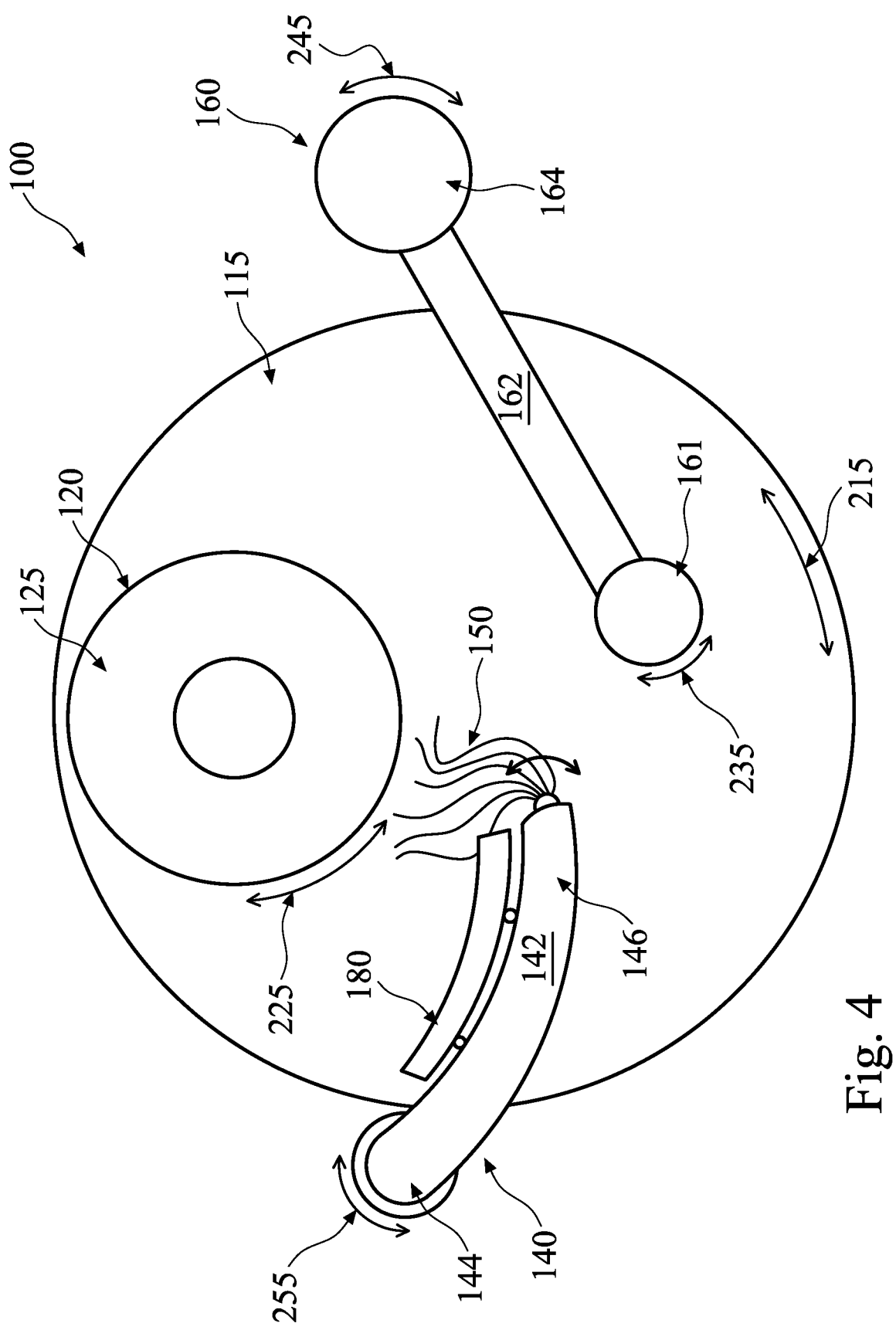

FIG. 4 illustrates a top/plan view of the CMP station 100 in accordance with some embodiments. Platen 105 is configured to rotate in a clockwise or a counter-clockwise direction, indicated by a double-headed arrow 215 around an axis extending through the center of platen 105. The polishing head 120 is configured to rotate in a clockwise or a counter-clockwise direction, indicated by a double-headed arrow 225 around an axis extending through the center of the polishing head 120. In some embodiments, the dresser assembly 160 is configured to rotate the pad conditioner head 161 in a clockwise or a counter-clockwise direction, indicated by a double-headed arrow 235 around an axis extending through the center of the pad conditioner head 161. A Pad conditioner arm 162 is configured to move the pad conditioner head 161 in an arc while applying downward pressure, for example, during rotation of the platen 105 and the pad conditioner head 161, as indicated by double-headed arrow 245. The pad conditioner arm 162 is attached to a pad conditioner base 164. A rotation of the pad conditioner base 164 around an axis extending through the pad conditioner base 164, as indicated by double-headed arrow 245, results in the pad conditioner head 161 moving in an arc. The slurry dispenser 140 may be configured to sweep in an arc over the polishing pad 115. A rotation of the slurry dispenser 140 around an axis extending through the slurry dispenser base 144, as indicated by double-headed arrow 255, results in the distal end 146 of the slurry dispenser 140 moving in an arc. Each of the above-described axes of rotation may be parallel to each other.

The base portion 182 (see FIG. 5) of the momentum vacuum assembly 180 may be positioned over the polishing pad 115 so that it makes contact with the polishing surface of the polishing pad 115. The momentum vacuum assembly 180 may be raised or lowered to adjust downward pressure applied to and distance from the polishing pad 115. The downward pressure applied to the polishing pad 115 may be varied by the raising or lowering of the momentum vacuum assembly 180. The momentum vacuum assembly 180 may be raised so as to avoid contact with the polishing pad 115 and create a gap between the base portion 182 (see FIG. 5) and the polishing pad 115.

Figure 5:
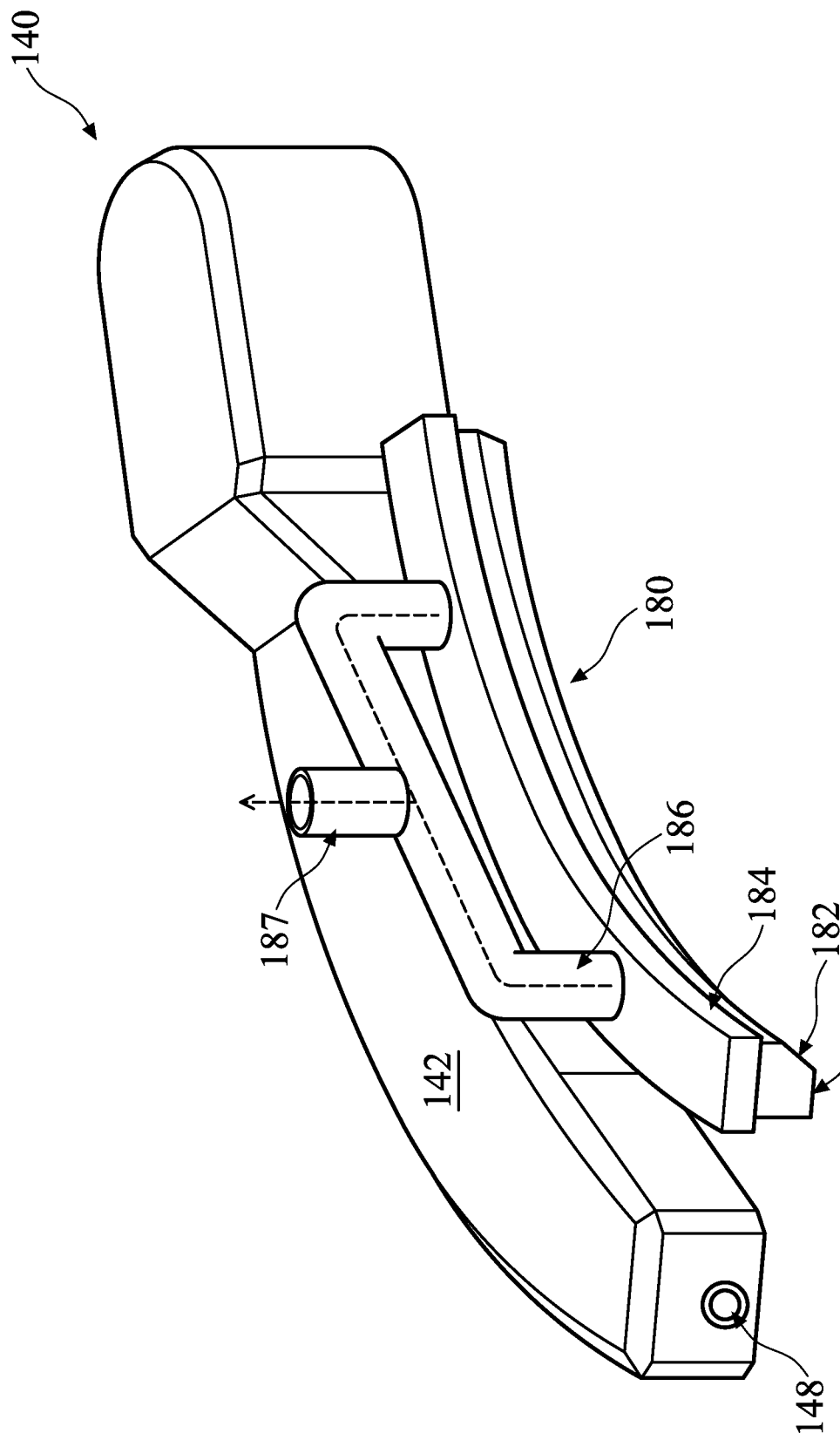

FIG. 5 illustrates a perspective view of the slurry dispenser 140 with momentum vacuum assembly 180 attached thereto. The slurry dispenser 140 is shown with cover 142 and the slurry outlet nozzle 148. Although the slurry outlet nozzle 148 is illustrated as being located in the end of the slurry dispenser 140, as mentioned above additional slurry outlet nozzles may be located under cover 142, along the arm of the slurry dispenser 140.

The momentum vacuum assembly 180 includes a base portion 182 which has an opening 185 extending along the bottom surface of the momentum vacuum assembly 180, following the contour thereof. The momentum vacuum assembly 180 also includes an upper portion 184. In some embodiments, the base portion 182 and the upper portion 184 may be separate pieces which are attached together by glue, screws, epoxy, or other fastener. In other embodiments, the base portion 182 and the upper portion 184 may be one integrated formed piece. The base portion 182 of the momentum vacuum assembly 180 may be made of a thermosetting plastic (i.e., thermoplastic polymer) such as polyether ether ketone (PEEK), polytetrafluoroethylene (PTFE), the like, or another suitably robust material which is selected to withstand the abrasives and chemicals of the slurry 150 and withstand the abrasive surface of the polishing pad 115. The base portion 182 cannot be made of soft plastic since it may rub against the surface of the polishing pad 115. A soft plastic may thus produce by-products or staining due to friction from the polishing pad 115. The upper portion 184 of the momentum vacuum assembly 180 may be made of any of the candidate materials for the base portion 182 or may also include less robust plastics such as polyvinyl chloride (PVC), chlorinated polyvinyl chloride (CPVC), polypropylene (PP), acrylonitrile butadiene styrene (ABS), or the like.

A suction manifold 186 may attached to the upper portion 184 and provide multiple ports from which to provide vacuum (represented by arrowed dotted lines) to the momentum vacuum assembly 180. Although two ports are illustrated in FIG. 5, anywhere from 1 to 7 ports may be used. Other embodiments may use another suitable number of ports for the suction manifold 186. In some embodiments, ports may not be round, but any shape, including a slot, square, rounded square, rectangle, and so forth. Suction manifold 186 is attached to openings (see FIGS. 7 and 8) in the upper portion 184. A vacuum line 187 is attached to the suction manifold 186.

Figure 6:
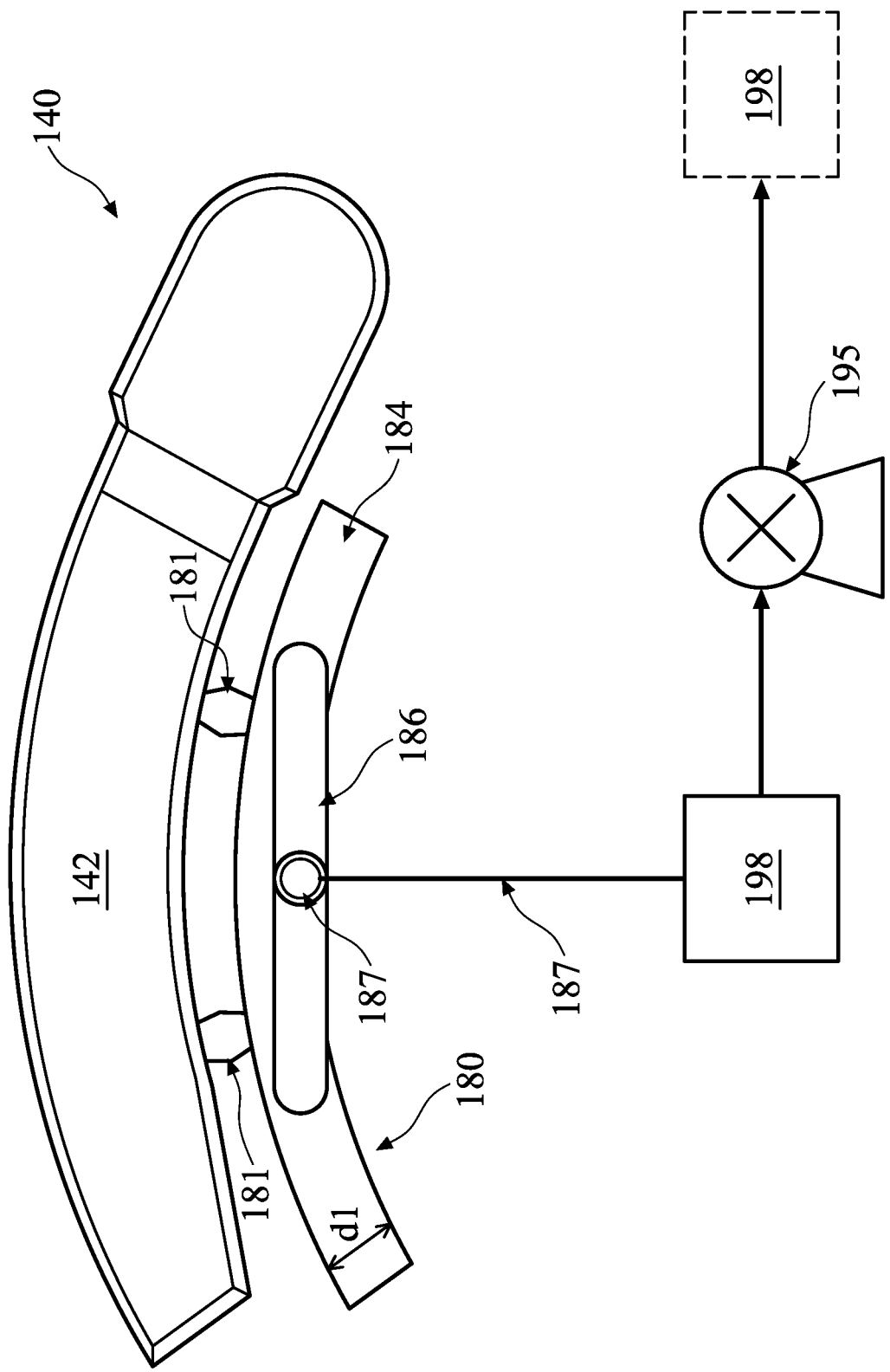

FIG. 6 illustrates a top/plan view of slurry dispenser 140 with the momentum vacuum assembly 180 attached thereto by attachment points 181. The momentum vacuum assembly 180 is illustrated as having an arc shape which is similar to the shape of the cover 142 of slurry dispenser 140. In some embodiments, momentum vacuum assembly 180 may have a straight/linear shape in top view. The upper portion 184 of the momentum vacuum assembly 180 is visible. Suction manifold 186 is attached to the vacuum line 187, which is attached to a vacuum source 195 and an exhaust processing system 198. Exhaust processing system 198 is configured to receive and dispose or recycle slurry and debris by-products as appropriate. Exhaust processing system 198 may also include a drain to dispose of slurry abrasives and debris by-products. Exhaust processing system 198 may be located on either side of the vacuum source 195, as illustrated by the dash outlined exhaust processing system 198.

Vacuum source 195 may be located outside the processing chamber of the CMP system 1 (FIG. 1). Any suitable vacuum pump may be used for vacuum source 195. For example, vacuum source 195 may be a rotary-type, scroll-type, tubing-type, or magnetic levitated-type vacuum pump. Vacuum source 195 may provide a pressure drop in the vacuum line 187 between about 10 psi and about 1000 psi, such as about 100 psi at an operating temperature between about 20° C. and about 40° C., such as about 30° C. Other pressures and operating temperatures are contemplated and may be used. The pressure drop provided by the vacuum source 195 may be selected based on the total cross-section of the outlets of the suction manifold 186, so as to maintain sufficient suction.

The width d1 of the momentum vacuum assembly 180 may be between about 10 cm and about 20 cm, such as about 12 cm. Other dimensions are contemplated and the width d1 may be less than 10 cm or greater than 20 cm, as appropriate. The length of the momentum vacuum assembly 180 is discussed below, in conjunction with FIG. 19.

Figure 7:
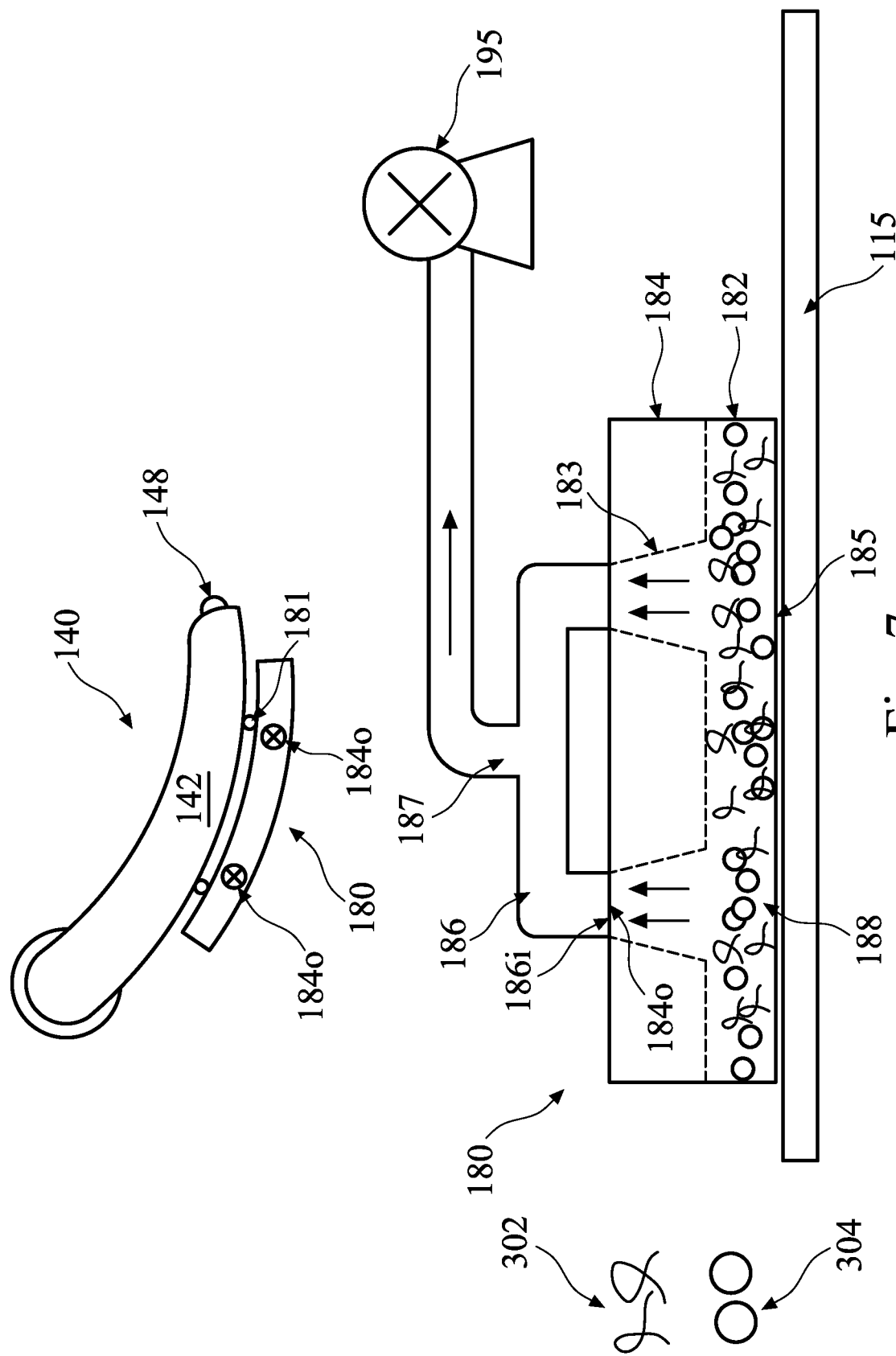

Turning now to FIG. 7, FIG. 7 illustrates a top/plan view of slurry dispenser 140 with the momentum vacuum assembly 180 attached thereto. Also illustrated is a lengthwise cross section of the momentum vacuum assembly 180. As illustrated in FIG. 7, an embodiment is shown which has two outlet ports 184o in the upper portion 184 of the momentum vacuum assembly 180. A cavity 188 is shown in the base portion 182 which is in the process of suctioning debris and by-products 302 and slurry abrasives 304 from the top of polishing pad 115. Debris and by-products 302 and slurry abrasives 304 are suctioned into an inverted funnel structure 183 from the cavity 188, which directs the debris and by-products 302 and slurry abrasives 304 to outlet ports 184o. Coupled to each of outlet ports 184o is a corresponding manifold inlet 186i of the suction manifold 186. Debris and by-products 302 and slurry abrasives 304 are sucked into the suction manifold 186 and then into the vacuum line 187 and returned to the exhaust processing system 198 (see FIG. 6).

Figure 8:
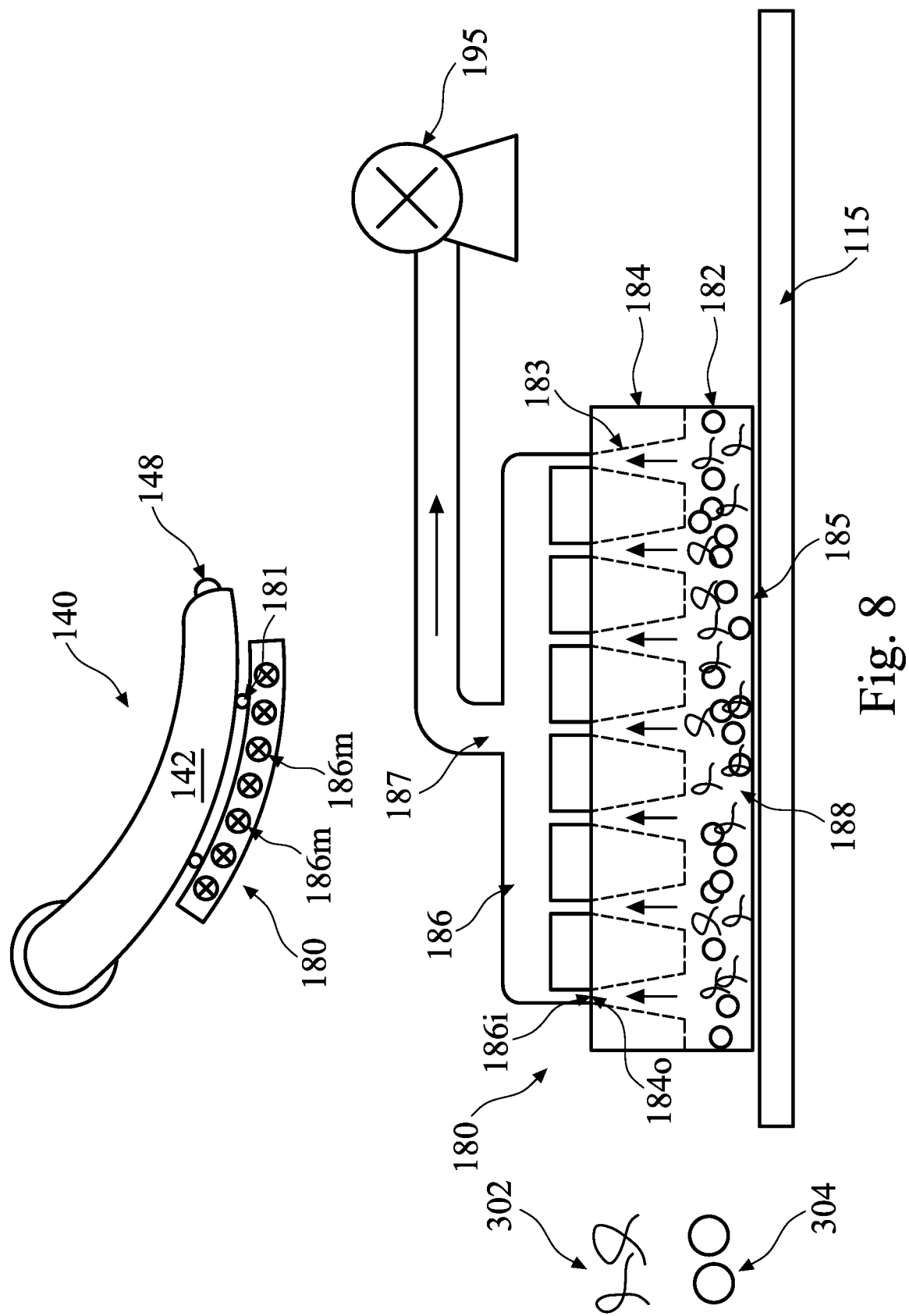

Referring now to FIG. 8, FIG. 8 illustrates a top/plan view of slurry dispenser 140 with the momentum vacuum assembly 180 attached thereto. Also illustrated is a lengthwise cross section of the momentum vacuum assembly 180. As illustrated in FIG. 8, an embodiment is shown which has seven outlet ports 184o in the upper portion 184 of the momentum vacuum assembly 180. The additional outlet ports 184o in the upper portion 184 can provide more suction uniformity within the whole cavity 188 and across the opening 185 (see FIG. 7). Cavity 188 is shown in the base portion 182 which is in the process of suctioning debris and by-products 302 and slurry abrasives 304 from the top of the polishing pad 115. Debris and by-products 302 and slurry abrasives 304 are suctioned into an inverted funnel structure 183 from the cavity 188, which directs the debris and by-products 302 and slurry abrasives 304 to outlet ports 184o. Coupled to each of outlet ports 184o is a corresponding manifold inlet 186i of the suction manifold 186. Debris and by-products 302 and slurry abrasives 304 are sucked into the suction manifold 186 and then into the vacuum line 187 and returned to the exhaust processing system 198 (see FIG. 6).

Although FIG. 7 illustrates an embodiment with two outlet ports 184o and FIG. 8 illustrates an embodiment with seven outlet ports 184o, these are presented only as examples and it should be understood that other embodiments can use other numbers of the outlet ports 184o. Also, although the outlet ports 184o are illustrated as being circular, it should be understood that the shape of the outlet ports 184o can be any suitable shape, such as oblong, oval, rectangular, and so forth.

Figure 9:
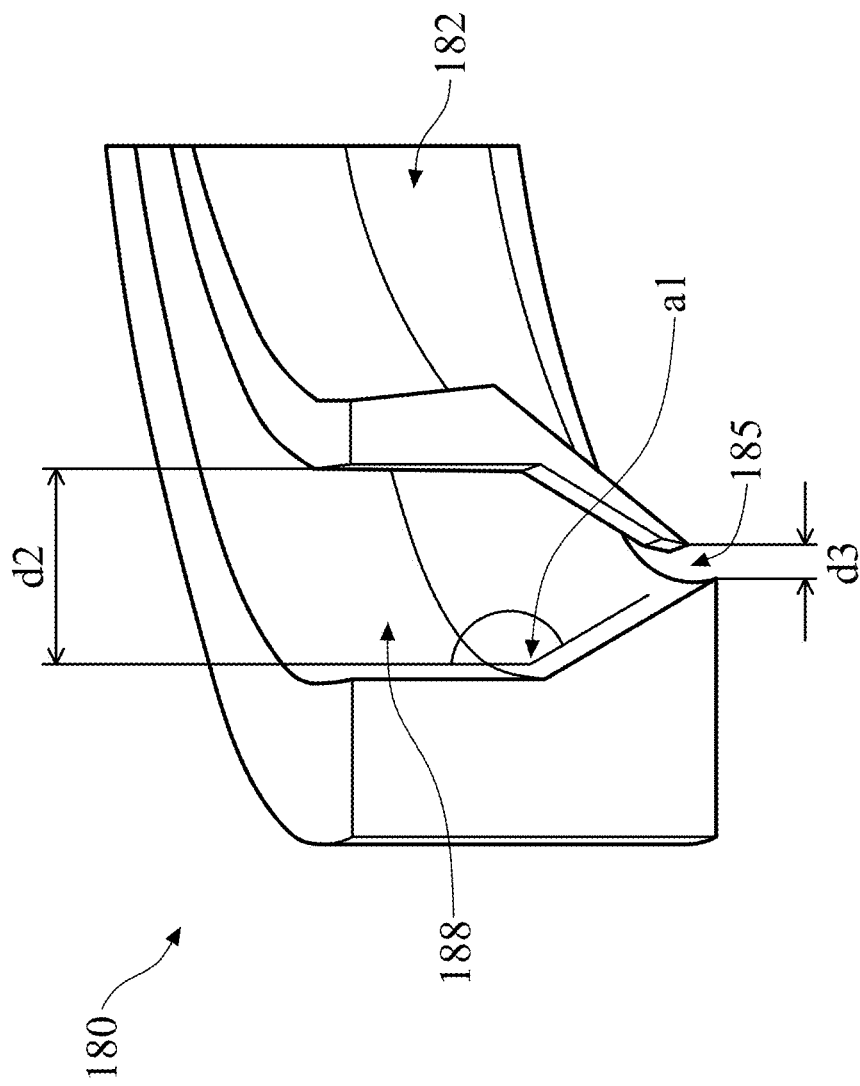

Referring now to FIG. 9, a perspective end-on view of the base portion 182 of the momentum vacuum assembly 180 is illustrated, in accordance with some embodiments. The base portion 182 of the momentum vacuum assembly 180 has an opening 185 therein which is a narrow slit, which expands into the cavity 188. The end of base portion 182 is shown as being removed for illustration purposes. The end of the base portion 182 may be closed by a separate piece or may be formed as having a closed end. Cavity 188 may have a width d2 which is between about 5 cm and about 8 cm, such as about 6 cm. Opening 185 may have a width d3 which is between about 1 cm and about 3 cm, such as about 2 cm. Other dimensions are contemplated and may be used. An angle of the sidewall of the cavity 188 to the angular sidewall of the base portion 182 may be between about 100° and about 160°, such as about 120°. Other angles may be used as appropriate. The arrangement of the narrow slit inlet of the opening 185 expanding into the cavity 188 is a hopper type of arrangement, and provides for a stronger pumping efficiency at the inlet opening 185.

Figure 10:
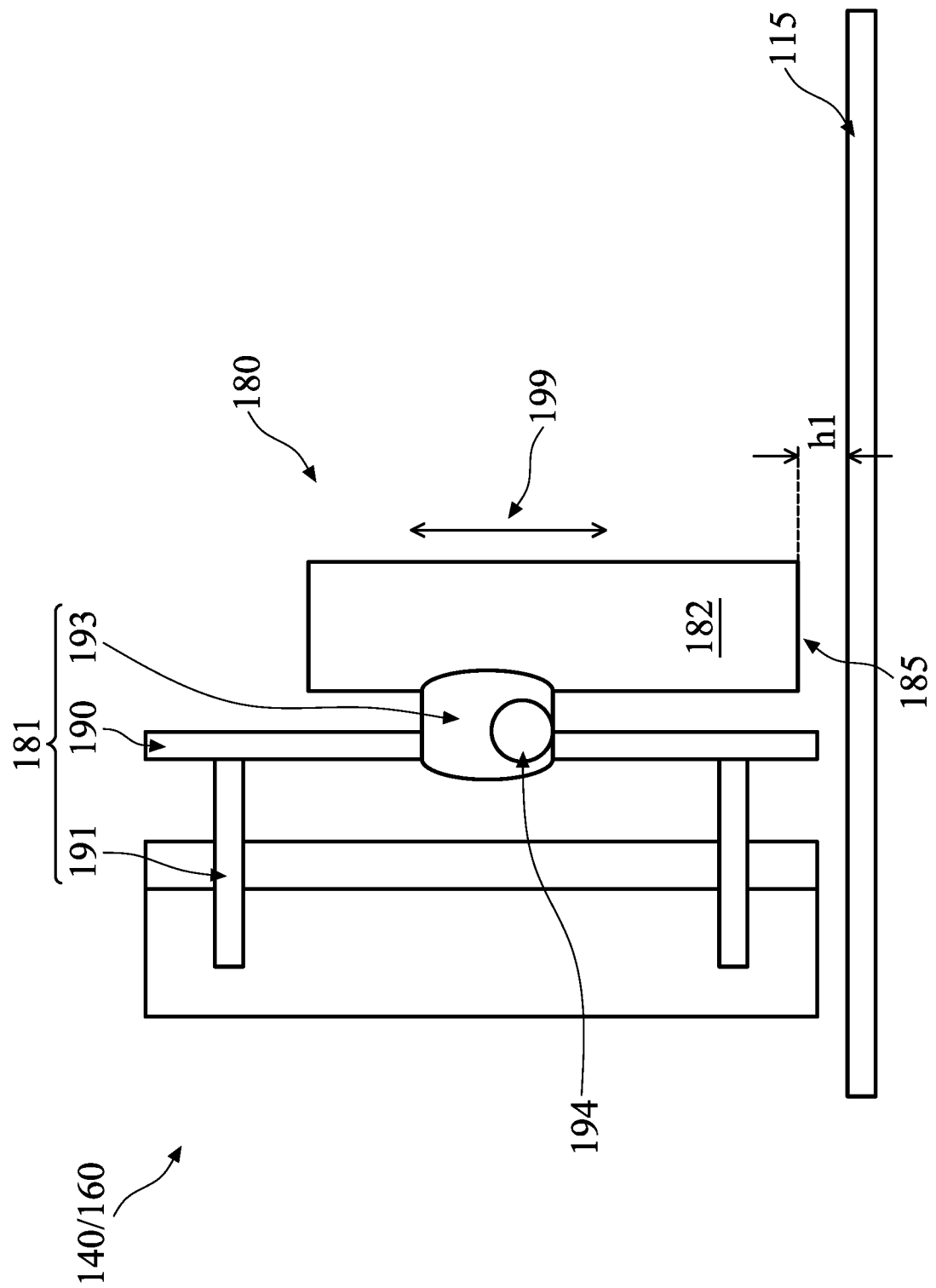
Figure 11:
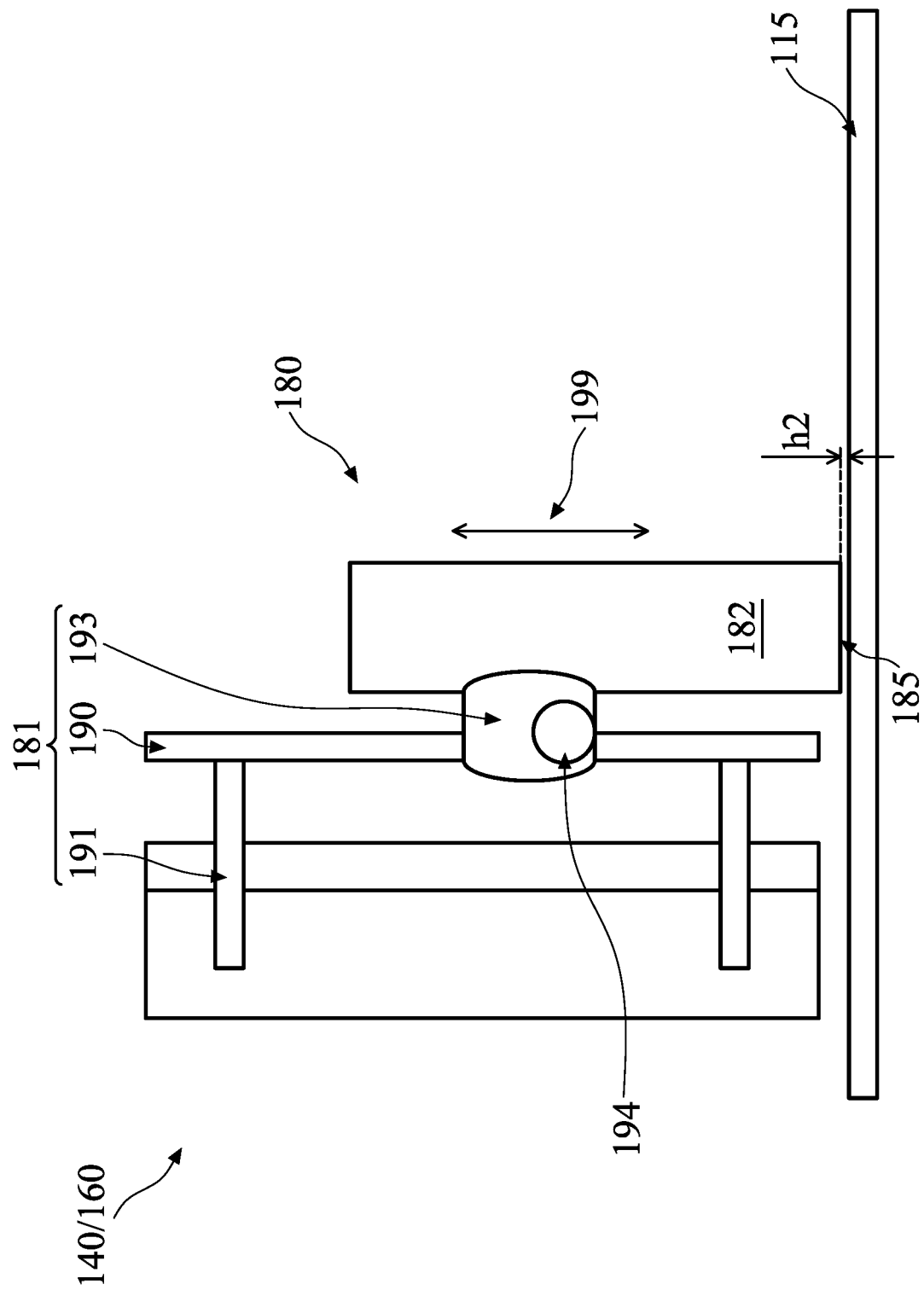

Referring now to FIGS. 10 and 11, FIGS. 10 and 11 show side views of attachment points 181, in accordance with some embodiments, which attach the momentum vacuum assembly 180 to the slurry dispenser 140 (or the dresser assembly 160 (see FIG. 19)). A vertical rail 190 is attached to the cover 142 of the slurry dispenser 140 (or the pad conditioner arm 162 of the dresser assembly 160) by fasteners 191. Fasteners 191 may be screws, bolts, pins, nails, or any suitable fastener. Attachment 193 connects the momentum vacuum assembly 180 to the vertical rail 190. Attachment 193 may be configured to move vertically up and down along the vertical rail 190. In some embodiments, the attachment 193 may have a motor, such as a motor 194, integrated therein to control movement of the attachment 193. In some embodiments, motor 194 may be a stepper motor and may control upward or downward direction of the attachment 193 by a voltage signal (e.g., positive or negative for opposite directions). In other embodiments, a motor, such as the motor 194, is located elsewhere and mechanically connected to the attachment 193 to slide the attachment 193 up or down along the vertical rail 190 as appropriate. In yet other embodiments, the vertical rail 190 may be a two piece assembly which slide against one another and the attachment 193 is affixed to one piece while the fasteners 191 are affixed to the other piece. Any suitable configuration may be used to allow vertical movement of the momentum vacuum assembly 180.

When the momentum vacuum assembly 180 is in a position where suction is not required, the momentum vacuum assembly 180 can be positioned further from the polishing pad 115 by a height h1 (FIG. 10) away from the polishing pad 115. In some embodiments, the height h1 can be between 0.25 cm and 2 cm, such as about 1 cm. Other distances are contemplated and may be used. When the momentum vacuum assembly 180 is in a position where suction is required, the momentum vacuum assembly 180 can be positioned closer to the polishing pad 115 by a height h2 (FIG. 11) away from the polishing pad 115. In some embodiments, the height h2 can be between 0 cm and 0.5 cm, such as about 0.2 cm. Other distances are contemplated and may be used.

Figure 12:
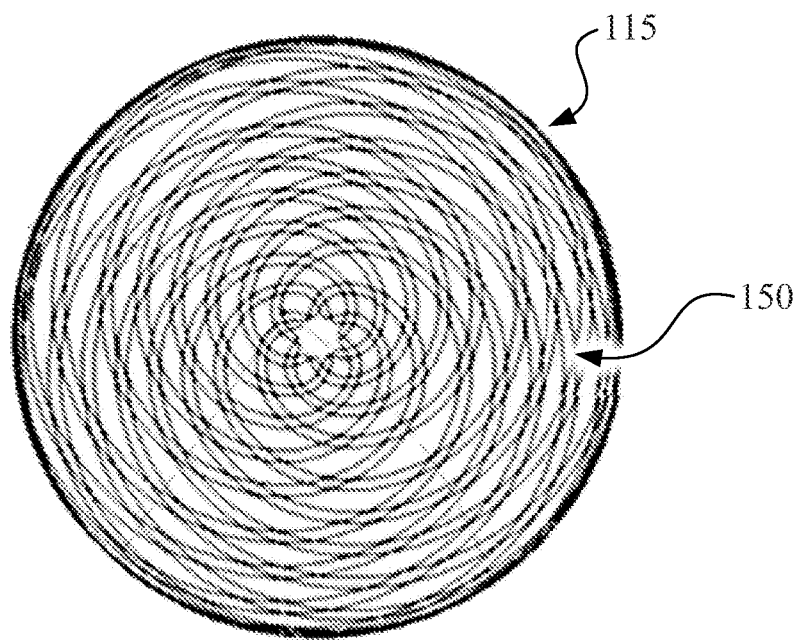
FIGS. 12 through 13 illustrate slurry dispersal over a polishing pad.
Figure 13:
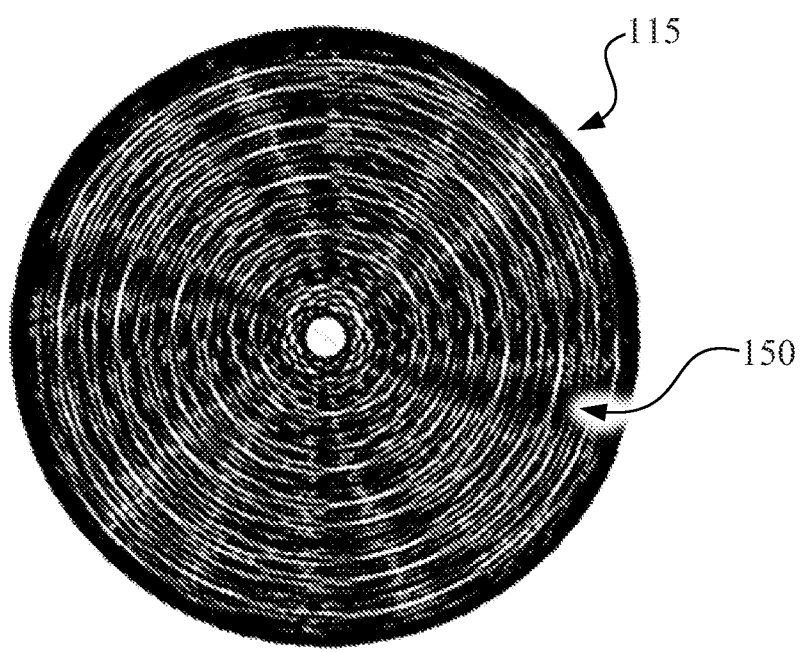

Referring now to FIGS. 12 and 13, slurry distribution over the polishing pad 115 is shown. In some embodiments, even when suction is not supplied, the momentum vacuum assembly 180 may be positioned relative to polishing pad 115 to help spread slurry 150 more evenly over the polishing pad 115. As shown in FIG. 12, when the momentum vacuum assembly 180 is not used to help spread slurry 150, distribution of slurry 150 on the polishing pad 115 is uneven. Slurry 150 is distributed by the polishing action of polishing head 120 (e.g., FIG. 2) against the polishing pad 115. However, when the momentum vacuum assembly 180 is positioned against the polishing pad 115 with the suction on or off, the momentum vacuum assembly 180 can more evenly spread slurry 150 over the polishing pad, as indicated in FIG. 13. When the momentum vacuum assembly 180 is positioned against the polishing pad 115 with the suction on, the momentum vacuum assembly 180 can also remove excessive slurry 150 and/or debris and by-products 302.

Figure 14:
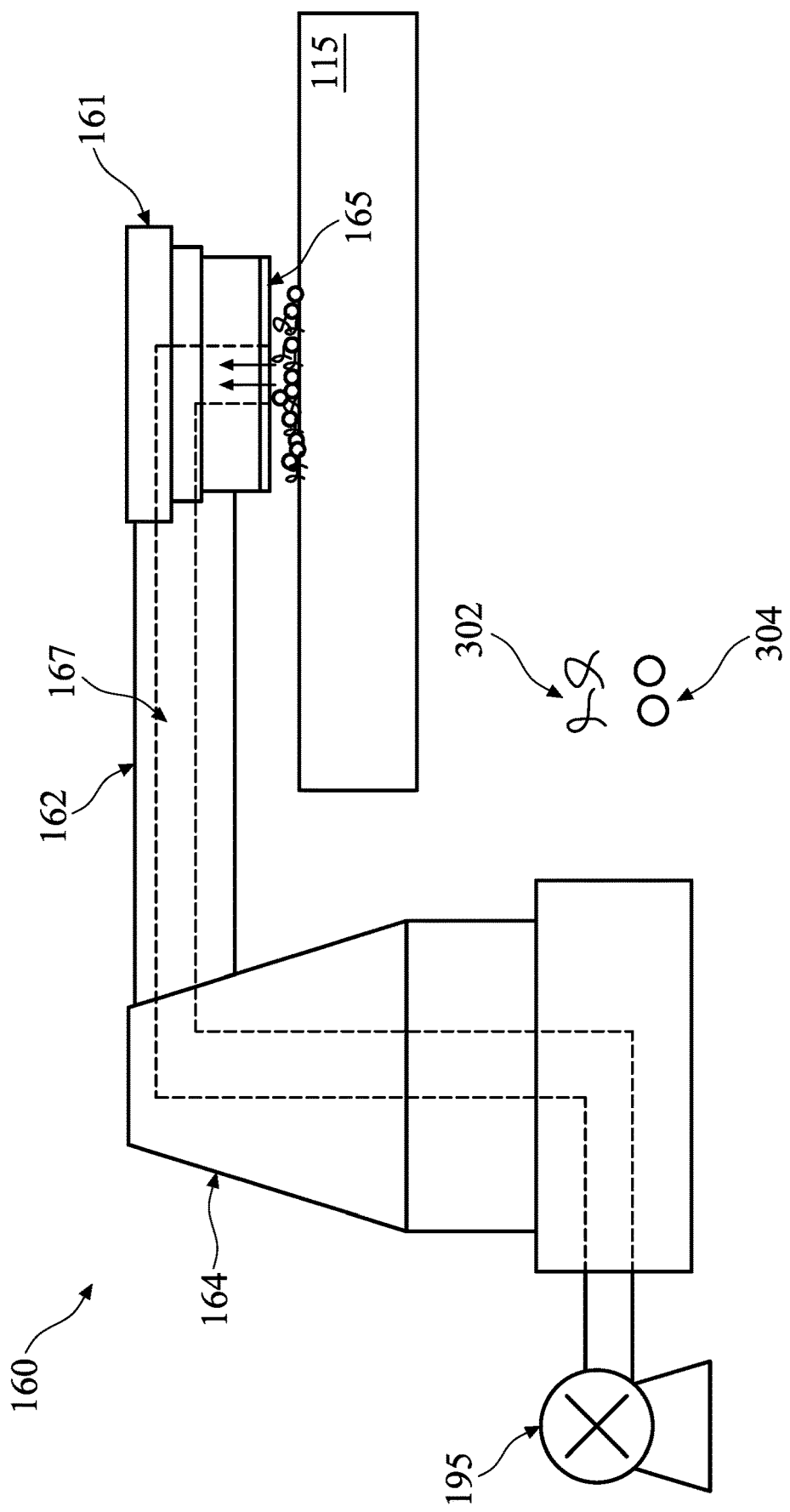
FIG. 14 illustrates a dresser assembly, in accordance with some embodiments.

Referring now to FIG. 14, a diagram of the dresser assembly 160 including the pad conditioner head 161 is illustrated, in accordance with some embodiments. In some embodiments, in addition to or instead of a momentum vacuum assembly 180, the dresser assembly 160 may be equipped with a vacuum source 195 and a suction line 167 which may be connected to an exhaust processing system (such as exhaust processing system 198 of FIG. 6). Openings 165o (see, e.g., FIGS. 16 through 18) in the pad conditioner disk 165 may allow for debris and by-products 302 and slurry abrasives 304 to be suctioned into the suction line 167 and to an exhaust processing system. In some embodiments, the suction line 167 may be configured to extend through the pad conditioner arm 162, such as illustrated in FIG. 14. In other embodiments, the suction line 167 may be configured to exit through a top of the pad conditioner head 161. In some embodiments, the vacuum source 195 is the same device as the vacuum source 195 of FIG. 6, while in other embodiments, the vacuum source 195 is a separate vacuum source. Vacuum source 195 of FIG. 14 may be a device similar to those described above with respect to the vacuum source 195 of FIG. 6.

Figure 16:
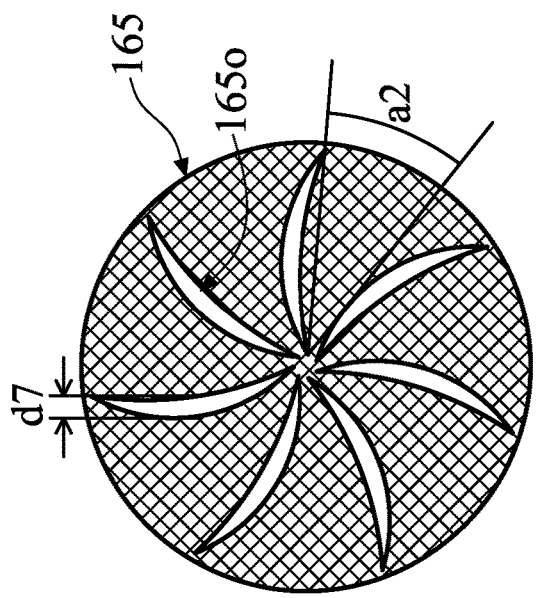
FIGS. 15 through 18 illustrate various views of pad conditioner disks, in accordance with some embodiments.
Figure 18:
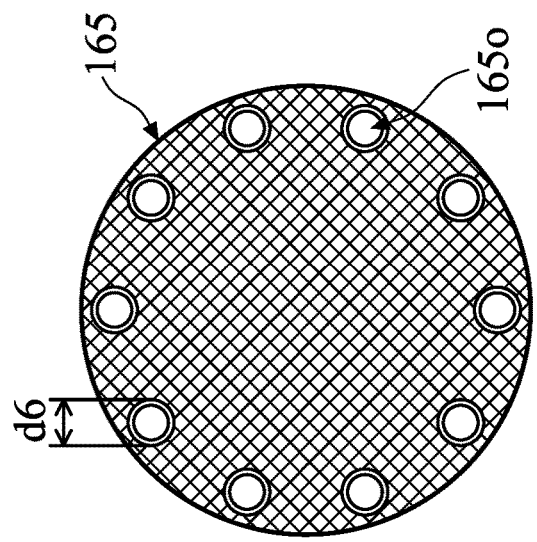
Figure 15:
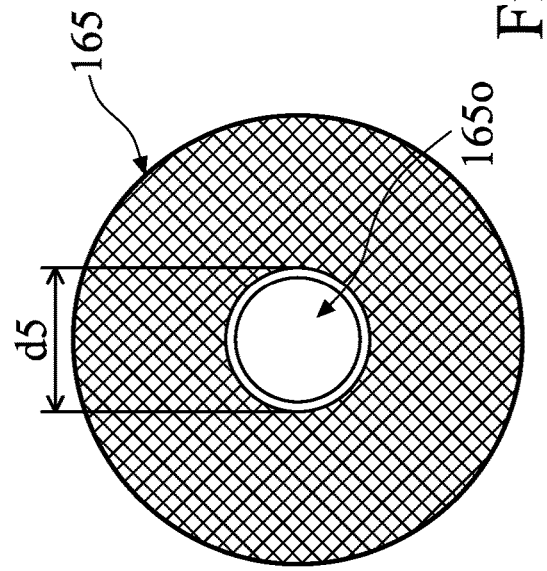
Figure 17:
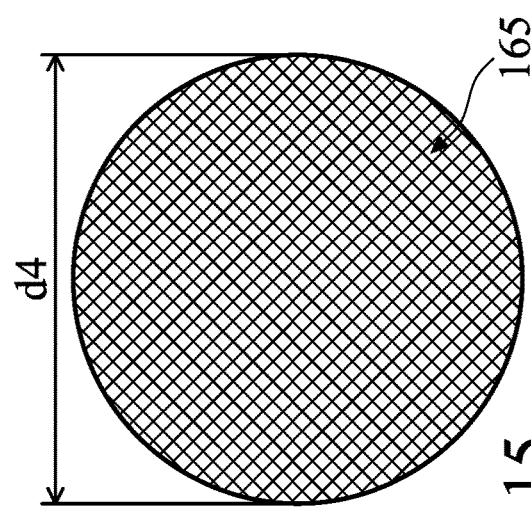

Turning to FIG. 15, a pad conditioner disk 165 is illustrated, which may be used in some embodiments. The pad conditioner disk 165 may be a typical pad conditioner disk, such as a diamond disk, and may not allow for suction of debris and by-products 302 and slurry abrasives 304 to pass therethrough. A diameter d4 of the pad conditioner disk 165 may be between about 8 cm and about 16 cm, such as about 10.8 cm. Other dimensions are contemplated and may be used. In FIG. 16, the pad conditioner disk 165 has an opening 165o at the center thereof which debris and by-products 302 and slurry abrasives 304 may be sucked through into suction line 167. A width d5 of the opening 165o of FIG. 16 may be between about 0.5 cm to about 3 cm, such as about 1 cm. Other dimensions are contemplated and may be used. In FIG. 17, the pad conditioner disk 165 has a series of openings 165o formed between the center of the pad conditioner disk 165 and the outer edge of the pad conditioner disk 165 which debris and by-products 302 and slurry abrasives 304 may be sucked through into suction line 167. Although 10 openings 165o are illustrated in FIG. 17, any number of the openings 165o may be included, depending on their size. The spacing of the openings 165o may be regular (e.g., an evenly spaced pattern) or irregular (e.g., random). A width d6 of the openings 165o of FIG. 17 may be between about 0.5 cm to about 2 cm, such as about 1 cm. In some embodiments, width d6 of the openings 165o of FIG. 17 may be between about 0.8 cm to about 2.2 cm. Other dimensions are contemplated and may be used. In FIG. 18, the pad conditioner disk 165 has a series of crescent shaped slit openings 165o formed therein in a fan formation which debris and by-products 302 and slurry abrasives 304 may be sucked through into the suction line 167. An angle a2 between each slit opening 165o may be between about 10° and 90°, such as about 60°. Other dimensions are contemplated and may be used. A width d7 of each of the slit openings 165o at their widest part may be between about 0.5 cm and about 1.2 cm, such as about 0.8 cm. Each of the layouts of the openings in FIGS. 16 through 18 are merely examples and other layouts are contemplated. In addition, the layouts of FIGS. 16 through 18 of the openings 165o may be combined to form, for example, the center opening 165o of FIG. 16 with the openings 165o of FIG. 17. It should also be understood that the shapes for openings 165o of FIGS. 16 through 18 are not limited to those illustrated but may include other shapes, such as polygons, ovals, polygons with rounded corners, elongated circles, and so forth. The pad conditioner disk 165 may contain fewer or more openings 165o than those illustrated in FIGS. 16 through 18.

Figure 19:
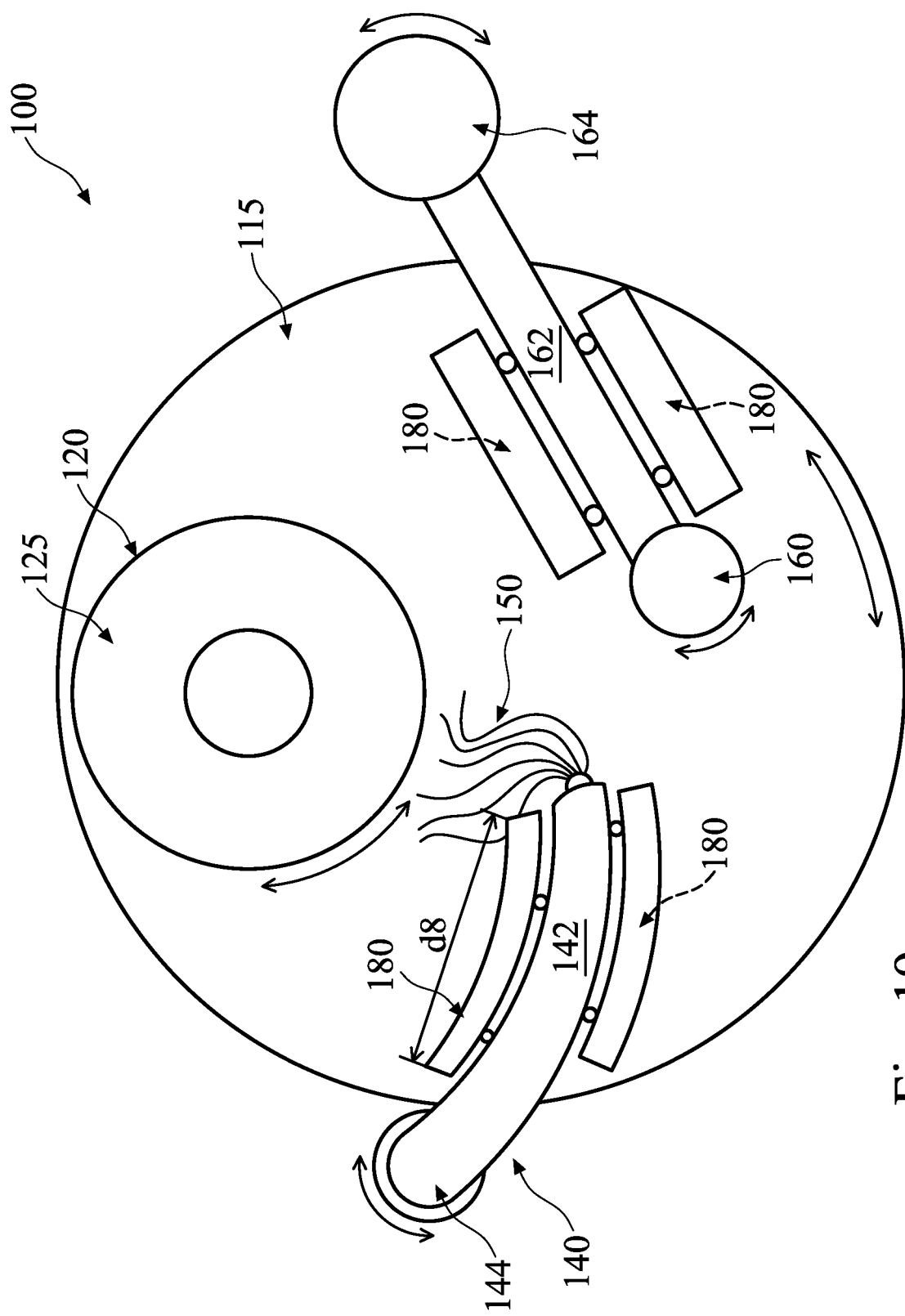
FIG. 19 illustrates a top view of a CMP station illustrating different placements for a momentum vacuum assembly, in accordance with some embodiments.

Turning now to FIG. 19, FIG. 19 illustrates various configurations for the momentum vacuum assembly 180, in accordance with some embodiments. As illustrated in FIG. 19, the momentum vacuum assembly 180 may be attached to either side of the slurry dispenser 140 and/or either side of the pad conditioner arm 162. The shape of the momentum vacuum assembly 180 may be curved such as illustrated when attached to the slurry dispenser 140, or may be rectangular, such as illustrated when attached to the pad conditioner arm 162. It should be understood that a curved momentum vacuum assembly 180 may be attached to the pad conditioner arm 162 and a rectangular momentum vacuum assembly may be attached to the slurry dispenser 140. In some embodiments, multiple (for example, one to four) of the momentum vacuum assembly 180 devices may be used in multiple locations.

A length d8 of the momentum vacuum assembly 180 may be configured so that the opening 185 in the base portion 182 does not overhang the polishing pad 115 when suction is active. In other words, the length d8 of the momentum vacuum assembly 180 is such that the opening 185 in the base portion of 182 length of the momentum vacuum assembly 180 is directly over the polishing pad 115 when suction is active. In some embodiments, the length d8 of the momentum vacuum assembly 180 is between about 10 cm and 25 cm, such as about 20 cm. Other dimensions are contemplated and may be used. In some embodiments, the diameter of the polishing pad 115 is about 77 cm, the length of the arm of the slurry dispenser 140 may be between about 30 cm and 40 cm, and the length d8 of the momentum vacuum assembly may be between about 10 cm and 35 cm. Other dimensions are contemplated and may be used. The momentum vacuum assembly 180 should also be positioned relative to the slurry dispenser 140 or the pad conditioner arm 162 so that it does not come in contact with the polishing head 120 as these arms swing back and forth during operation.

Figure 20:
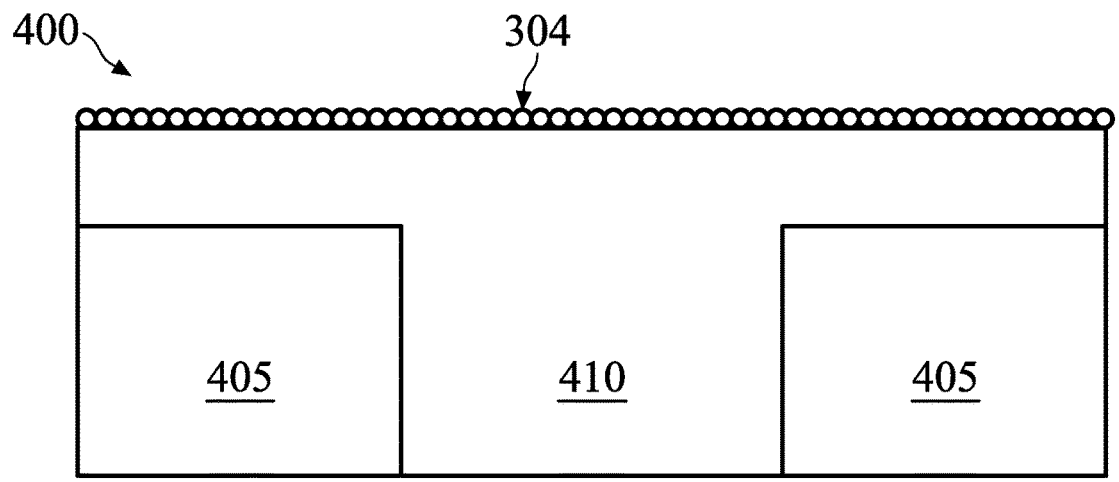
FIGS. 20 through 22 illustrate cross-sectional views of intermediate steps of a workpiece in a polishing process, in accordance with some embodiments.
Figure 21:
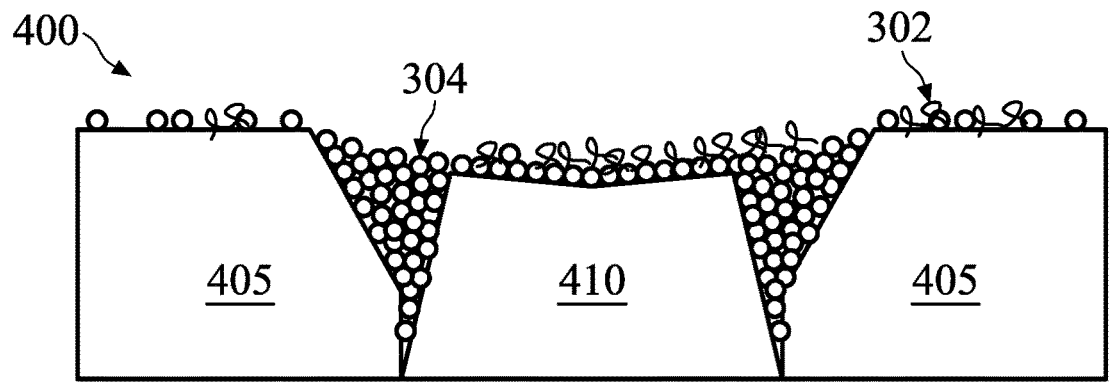
Figure 22:
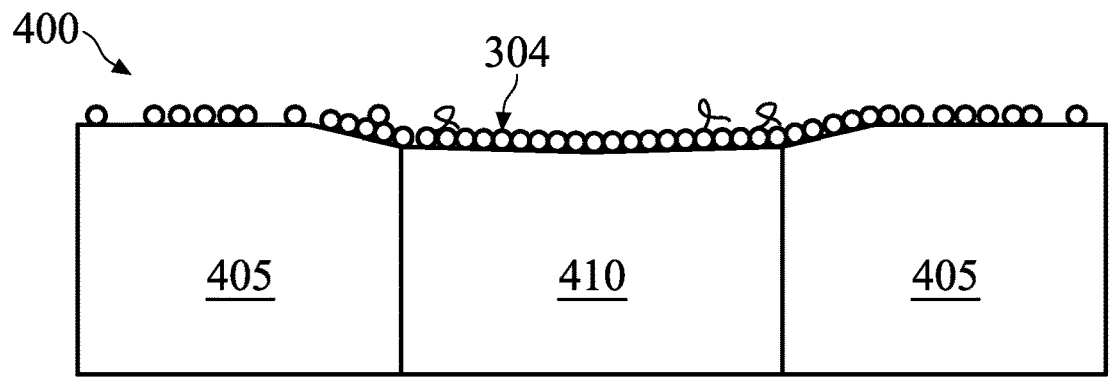

Referring now to FIGS. 20 through 22, FIGS. 20 through 22 illustrate cross-sectional views of intermediate steps of a workpiece 400 in a CMP process. FIGS. 20 through 22 illustrate cross-sectional views of the workpiece 400 (e.g., workpiece 110 of FIG. 2) before and after a CMP process. The workpiece 400 may include various features which are subject to a CMP process. Slurry 150 (see FIG. 2) may be disposed over the workpiece, including abrasives 304.

In some embodiments, the elements 405 of workpiece 400 may be an insulating material such as a nitride, oxide, polymide, spin-on-carbon, encapsulant, and so forth. In such embodiments, the element 410 may be a conductive material, such as may be used in a metal plug or seed layer. In some embodiments, the elements 405 may be other features of the workpiece 400, including active or dummy polysilicon or metal gate stacks. In such embodiments, the element 410 may be an insulating material such as bulk SiN, another nitride, an oxide, carbon, and so forth. Other embodiments may include other features for the elements 405 and 410. Embodiments can combine different ones of these structures on one workpiece.

The slurry 150 may be dispensed onto the polishing pad 115 by the slurry dispenser 140 in order to assist in the removal of the material of the element 410. In embodiments where the element 410 is a conductive material, a reactant in the slurry 150 may react with the conductive material to form a sacrificial layer of an oxide (not shown) of the conductive material along the exposed surface of element 410. The oxide may then be removed by the grinding effect of the polishing pad 115 along with the assistance of the abrasives within the slurry 150. In embodiments where the element 410 is an insulating material, a reactant in the slurry 150 may react with the insulating material to decompose or weaken the insulating material. The grinding effect of the polishing pad 115 along with the assistance of the abrasives within the slurry 150 may then remove the decomposed or weakened insulating material. Using this process, removal of the material of the element 410 may be performed, and may be continued until a desired thickness is achieved or until the elements 405 are exposed.

Referring now to FIG. 21, in a typical CMP process, excess abrasives 304 may collect at the interfaces of one material (e.g., element 405) with another material (e.g., the element 410) and cause dishing or other defects. In some embodiments, along with the excess abrasives 304, debris and by-products 302 from the CMP process may collect in these margins at the interfaces of materials and further exacerbate defects.

Referring now to FIG. 22, in an embodiment CMP process, debris and by-products 302 and excess abrasives 304 are managed by the momentum vacuum assembly 180 and/or the dresser assembly 160 with the pad conditioner disk 165 having openings 165o therein to remove debris and by-products 302 and excess abrasives 304. As a result, the workpiece 400 has less defects and an improved removal rate across the workpiece 400 surface during the polish process. This reduces wafer pattern loading and defect risk.

Figure 23:
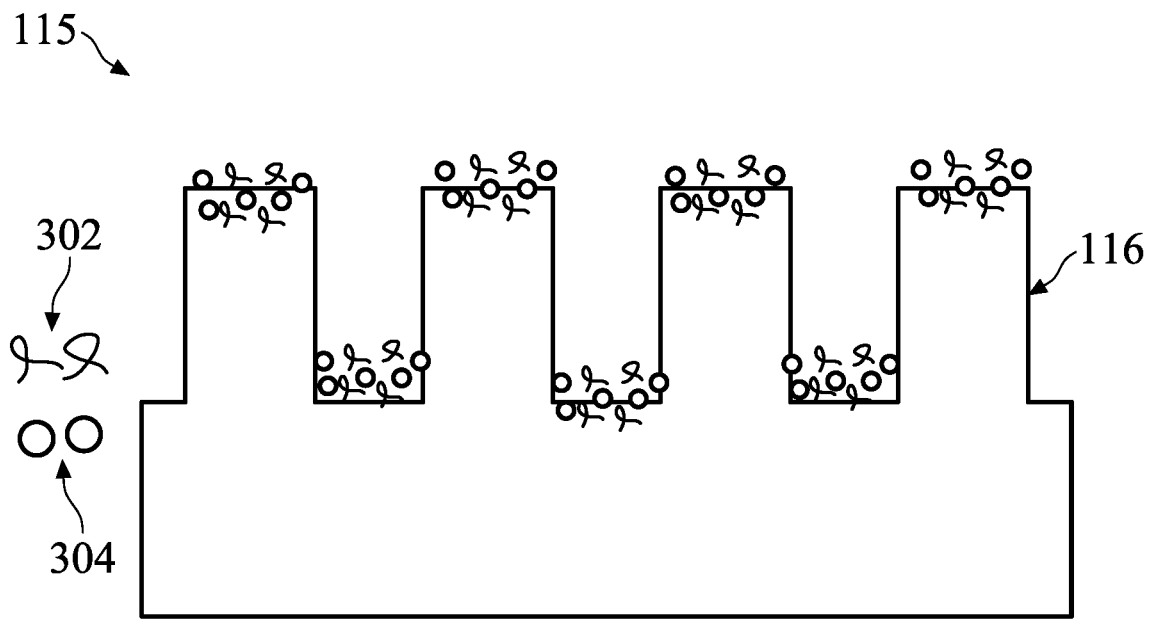
FIGS. 23 through 24 illustrate cross-sectional views of intermediate steps of a polishing pad in a polishing process, in accordance with some embodiments.
Figure 24:
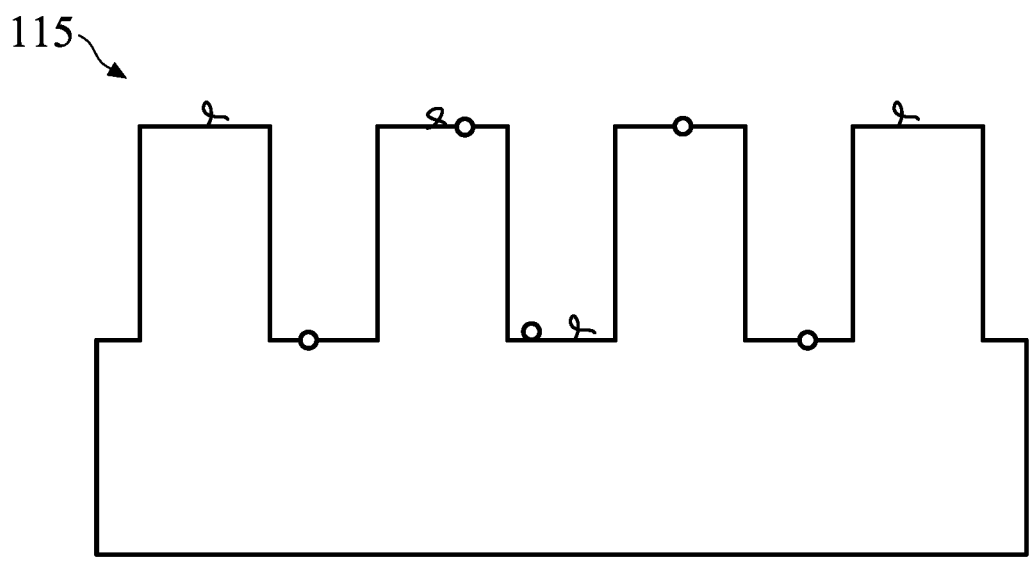

Referring now to FIG. 23, a cross-section of the polishing pad 115 is illustrated having an abrasive surface 116. Polishing pad 115 is illustrated in FIG. 23 during a polishing process, showing debris and by-products 302 and excess abrasives 304 accumulated in the abrasive surface 116. The build-up of debris and by-products 302 and excess abrasives 304 in the polishing pad 115 inhibits removal rate and reduces effectiveness of the polishing pad 115. FIG. 24 illustrates the same cross-section of the polishing pad 115 following the removal of debris and by-products 302 and excess abrasives 304 by the momentum vacuum assembly 180 and/or by the dresser assembly 160. As illustrated in FIG. 24, debris and by-products 302 and excess abrasives 304 have been substantially removed.

By removing debris and by-products 302 and excess abrasives 304 from the CMP process surface defects can be reduced or eliminated. Surface defects may include, for example, residue or scratch defects. Local loading may also be reduced. In one example, without the use of the momentum vacuum assembly 180 in a CMP process local loading was measured at about 35 Å, but with the use of the momentum vacuum assembly 180 in a CMP process local loading was measured at about 12 Å.

Figure 25:
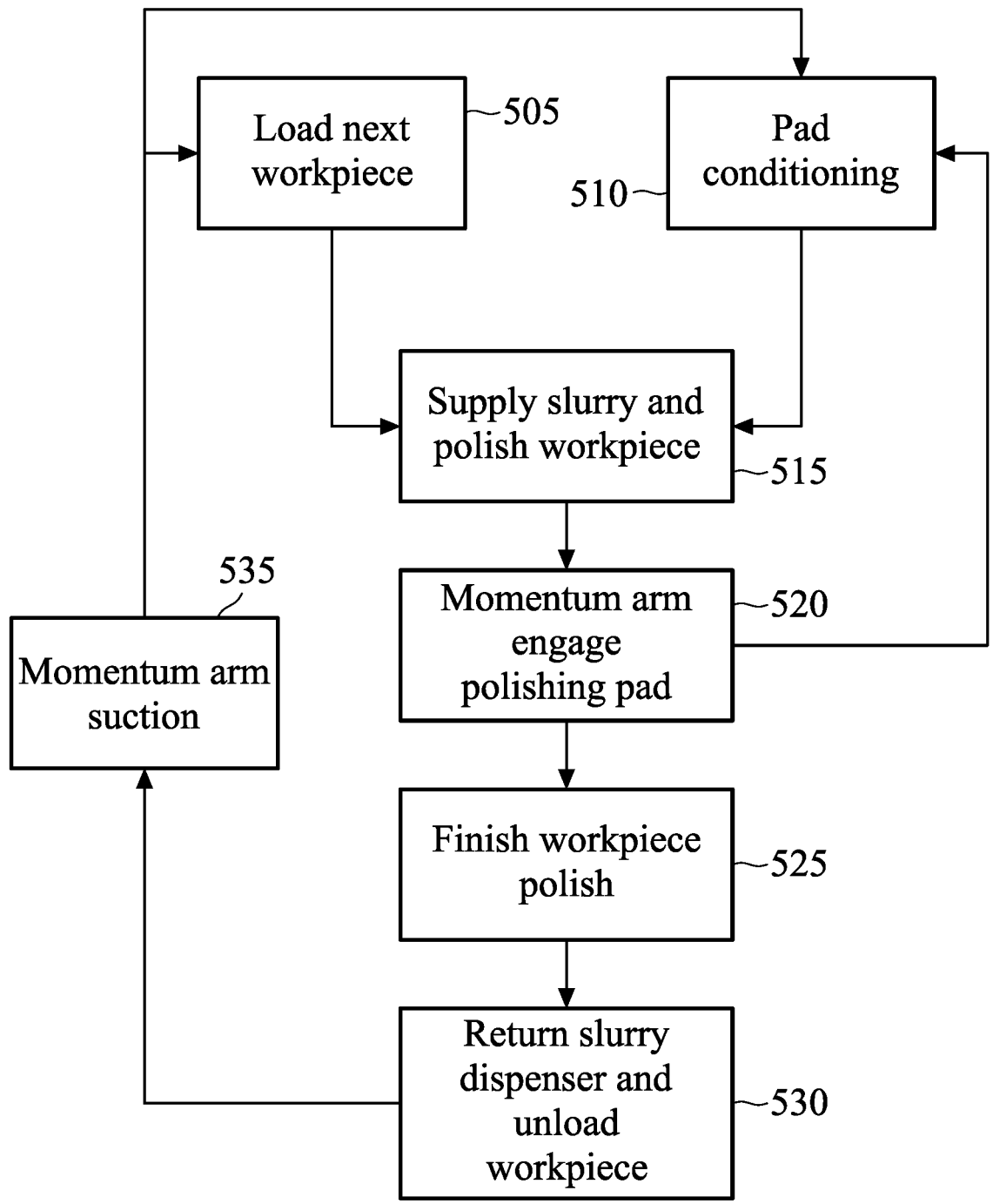
FIG. 25 illustrates a flow diagram of a polishing process of a workpiece, in accordance with some embodiments.

Referring now to FIG. 25, a flow diagram of a CMP process is illustrated, in accordance with some embodiments. At 505, a next workpiece to be processed may be loaded into a CMP station, such as the CMP station 100. If a previous workpiece was recently unloaded from the CMP station, a pad conditioning process 510 may simultaneously take place. In some embodiments, the pad conditioning process 510 may implement a suctioning dresser assembly, such as the dresser assembly 160 with the pad conditioner disk 165 having openings 165o therein to remove debris and by-products and excess abrasives from a polishing surface of the polishing pad used in the CMP process. In some embodiments, the pad conditioning process 510 with suction may be performed after processing a certain number of workpieces (for example, after 5 or 10 workpieces, and so forth) or after a certain amount of time since the last pad conditioning process with suction. In some embodiments, the pad conditioning process 510 may be performed continuously while the CMP process is ongoing. In such embodiments, suctioning may be turned on or off depending on process conditions. For example, suctioning may be turned on during polishing and turned off while the workpiece is unloaded and another workpiece is loaded, or suctioning may be turned off during polishing and turned on while the workpiece is unloaded and another workpiece is loaded.

In some embodiments, the pad conditioning process 510 may be performed in a continuous manner during polishing to remove debris and by-products as well as excess slurry resulting from the polishing. At 515, a slurry dispenser supplies fresh slurry for polishing the workpiece during the CMP process. The workpiece may be polished by rotating the polishing pad and/or the workpiece while contacting the workpiece to the polishing pad. At 520, a momentum vacuum assembly, such as momentum vacuum assembly 180, may be positioned to engage the polishing surface of the polishing pad. In some embodiments, the vacuum source for the momentum vacuum assembly may be turned on before polishing and continue throughout the polishing process. In some embodiments, the vacuum source for the momentum vacuum assembly may be turned on during the polishing and turned off after the polishing is complete. In other embodiments, the vacuum source may be turned on after polishing or at intervals during polishing as the polishing process is occurring. In some embodiments, the vacuum source may be turned on after processing a certain number of workpieces (for example, after 5 or 10 workpieces, and so forth) or after a certain amount of time since the last vacuuming action by the momentum vacuuming assembly. The momentum vacuum assembly may spread the slurry more evenly over the polishing pad to provide a more effective polish. In some embodiments, the momentum vacuum assembly may be used with or without suction to contact the polishing pad to spread the slurry. In some embodiments, when the vacuum source is not turned on, the momentum vacuum assembly may be raised from the surface of the polishing pad.

At 525, the workpiece polishing is finished. The polishing process may involve several different slurries depending on the material that is polished. At 530, the slurry dispenser is returned to a side of the polishing pad and the workpiece is unloaded. At 535, in some embodiments, the momentum vacuum assembly may have its suction engaged and slurry, debris, and by-products may be removed from the polishing pad by suction. The flow may then return to load the next workpiece at 505 and/or condition the polishing pad. In some embodiments, the next workpiece being loaded 505, the pad conditioning process 510, and the momentum vacuum assembly suction 535 may be performed at the same time.

Embodiments may improve removal rate during a CMP process by removing debris and polishing by-products as well as excess abrasives from a polishing surface of a polishing pad of a CMP station. A momentum vacuum assembly may be affixed to the slurry dispenser or pad conditioning arm and may provide suction to remove the debris, by-products, and abrasives. The momentum vacuum assembly may also help spread slurry more evenly over the polishing pad. Holes in a pad conditioning disk of a pad dresser assembly may provide openings for suctioning through the holes to remove debris, by-products, and abrasives through the pad conditioning disk. Embodiment devices removing debris, by-products, and excess abrasives increases removal rate during the CMP process and decreases inline defects resulting from the CMP process.

One embodiment is a method including depositing a slurry onto a polishing pad of a chemical mechanical polishing (CMP) station. A workpiece is polished and polishing by-products and slurry are removed from the polishing pad by a vacuum head.

Another embodiment is a method including polishing a workpiece in a chemical mechanical polishing (CMP) station, the CMP station including a polishing pad, a slurry dispenser arm, a dresser apparatus, a workpiece holder, and a momentum vacuum assembly. Debris is suctioned from the polishing pad by the momentum vacuum assembly.

Another embodiment is a chemical mechanical polishing (CMP) apparatus including a polishing pad configured to rotate during a CMP process. The apparatus also includes a slurry dispenser configured to deposit a slurry onto a polishing surface of the polishing pad. The apparatus further includes a workpiece holder and a momentum vacuum assembly, the momentum vacuum assembly including a slotted opening facing the polishing surface of the polishing pad, the momentum vacuum assembly configured to move closer to or further from the polishing pad. The apparatus also includes a first suction line coupled to an upper portion of the momentum vacuum assembly and leading to a first vacuum source, the first suction line configured to transport polishing products which have been removed from the polishing pad through the slotted opening.

Another embodiment is an apparatus including a polishing pad and a wafer holder disposed over the polishing pad. It also includes a slurry dispensing arm, where the slurry dispensing arm is configured to provide a polishing slurry to the polishing pad. The vacuum assembly is disposed over the polishing pad, and the vacuum assembly is configured to suction polishing slurry and polishing debris from the polishing pad. The vacuum assembly includes elongated vacuum chamber and a curved slotted opening proximate the polishing pad. The slotted opening is narrower than the vacuum chamber, and the vacuum chamber tapers to the slotted opening. The apparatus also includes a vacuum line coupled to the vacuum assembly.

Another embodiment is a device including a load lock, a high rate polishing station, and a buffing polishing station, where the buffing polishing station includes: a polishing pad, a slurry dispenser, a wafer holder, and a slit vacuum apparatus. The slit vacuum apparatus is coupled to a suction line and is attached to a rail, where the rail is configured to move the slit vacuum apparatus closer to the polishing pad or further from the polishing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical polishing (CMP) apparatus comprising:
   a polishing pad configured to rotate during a CMP process;
   a slurry dispenser configured to provide a slurry onto a polishing surface of the polishing pad;
   a workpiece holder;
   a vacuum assembly, the vacuum assembly comprising:
      a base portion, the base portion including a bottom surface having therein a slotted opening facing the polishing surface of the polishing pad, a first outer side extending in a first direction, a second outer side extending in the first direction, and a first cavity above the slotted opening, the first cavity having a longitudinal axis extending in the first direction, the slotted opening and the first cavity being defined by two opposing sidewalls, a distance between the two opposing sidewalls being at a minimum value at the slotted opening, the distance between the two opposing sidewalls increasing substantially linearly and continuously from the slotted opening to a first region of the first cavity, the distance being constant from the first region of the first cavity to a top of the base portion, when viewed in cross-section in a direction orthogonal to the first direction;
an upper portion extending from the top of the base portion, the upper portion including a first extension of the first outer side, a second extension of the second outer side, and a second cavity between the first extension of the first outer side and the second extension of the second outer side, the second cavity being defined by a first inner sidewall of the upper portion and a second inner sidewall of the upper portion, wherein the second cavity is in fluid flow communication with the first cavity, a distance between the first inner sidewall and the second inner sidewall being at a maximum where the second cavity meets the first cavity and decreasing to a minimum where the second cavity meets an outlet port, when viewed in a cross-section in a direction parallel to the first direction; and
a first suction line coupled to the upper portion of the vacuum assembly and leading to a first vacuum source, the first suction line configured to transport polishing products that have been removed from the polishing pad through the slotted opening.

2. The CMP apparatus of claim 1, wherein the vacuum assembly is mounted by an adjustable rail configured to move the vacuum assembly up and/or down.

3. The CMP apparatus of claim 1, wherein the vacuum assembly further comprises an upper manifold coupled to the outlet port, the upper manifold having outlets leading to the first suction line.

4. The CMP apparatus of claim 1, further comprising:
a dresser apparatus comprising a dresser head and a dresser arm, the dresser head being configured to hold a dresser pad, the dresser arm being configured to sweep the dresser pad across the polishing surface of the polishing pad to condition the polishing pad, wherein the dresser pad comprises at least one hole formed therein; and
a second suction line in the dresser head coupled to the at least one hole of the dresser pad and a second vacuum source.

5. The CMP apparatus of claim 4, wherein the vacuum assembly is mounted to a side of the dresser arm.

6. The CMP apparatus of claim 1, further comprising: an attachment mechanism attached to the vacuum assembly, the attachment mechanism configured to position the slotted opening relative to the polishing pad.

7. The CMP apparatus of claim 1, wherein the second cavity in the upper portion comprises a plurality of second cavities, and further wherein the plurality of second cavities are aligned in the first direction and extend from the top of the base portion to a top of the upper portion.

8. An apparatus comprising:
a polishing pad;
a wafer holder disposed over the polishing pad; and
a slurry dispensing arm, the slurry dispensing arm configured to provide a polishing slurry to the polishing pad;
a vacuum assembly disposed over the polishing pad, the vacuum assembly configured to suction polishing slurry and polishing debris from the polishing pad, the vacuum assembly comprising an elongated vacuum chamber having a first cross-sectional width at a widest point when viewed in a first cross-sectional view, the vacuum assembly further comprising a bottommost surface defining a slotted opening, the slotted opening having a second cross-sectional width less than the first cross-sectional width when viewed in the first cross-sectional view, the elongated vacuum chamber width tapering substantially linearly from the first cross-sectional width to the second cross-sectional width when viewed in the first cross-sectional view;
the vacuum assembly further including a plurality of second vacuum chambers in communication with the elongated vacuum chamber and in communication with an outlet port, each second vacuum chamber having a third cross-sectional width at a point of communication with the elongated vacuum chamber and having a fourth cross-sectional width less than the third cross-sectional width at a point of communication with the outlet port, the fourth cross-sectional width being less than the third cross-sectional width; and
a vacuum line coupled to the vacuum assembly.

9. The apparatus of claim 8, further comprising a pad dresser arm, the pad dresser arm configured to recondition the polishing pad, wherein the vacuum assembly is attached to the pad dresser arm.

10. The apparatus of claim 8, further comprising:
a pad dresser arm and a pad conditioner disk attached to the pad dresser arm, the pad conditioner disk having one or more holes disposed therein; and
a second vacuum line coupled to the one or more holes of the pad conditioner disk.

11. The apparatus of claim 10, wherein:
the one or more holes in the pad conditioner disk are crescent shaped.

12. The apparatus of claim 10, wherein:
the one or more holes in the pad conditioner disk are disposed around a periphery of the pad conditioner disk.

13. The apparatus of claim 8, wherein the vacuum assembly further comprises an upper manifold attached to the elongated vacuum chamber, the upper manifold comprising two or more vacuum outlets coupled to the vacuum line.

14. The apparatus of claim 8, wherein the vacuum assembly is configured to contact the polishing pad while the polishing slurry is dispensed from the slurry dispensing arm.

15. The apparatus of claim 8, wherein the vacuum assembly extends longitudinally in a horizontal direction and wherein the plurality of second vacuum chambers are located vertically above the elongated vacuum chamber.

16. A chemical mechanical polishing (CMP) apparatus comprising
a polishing pad,
a slurry dispenser,
a workpiece holder,
a vacuum apparatus coupled to a suction line and having a bottommost surface and a topmost surface, the bottommost surface defining a slotted opening therein, a cavity therein, and sidewalls defining the cavity, wherein the sidewalls have a cross-sectional distance therebetween, the cross-sectional distance being at a minimum value at the slotted opening and increasing substantially continuously and linearly to a first region of the cavity, the cross-sectional distance being constant from the first region of the cavity to a top of the cavity; and
a plurality of inverted funnel cavities extending from the top of the cavity to the topmost surface of the vacuum apparatus, each inverted funnel cavity of the plurality of inverted funnel cavities having a first diameter opening at the top of the cavity and having a second diameter opening at the topmost surface of the vacuum apparatus, the second diameter opening being less than the first diameter opening.

17. The CMP apparatus of claim 16, wherein the polishing pad, slurry dispenser, workpiece holder, and vacuum apparatus are part of a first polishing station, and further comprising:
   a load lock; and
   a second polishing station, the second polishing station configured to polish a workpiece surface at a rate that is higher than a rate of the first polishing station.

18. The CMP apparatus of claim 17, further comprising:
   a pad dresser arm, wherein the vacuum apparatus is attached to the slurry dispenser or the pad dresser arm.

19. The CMP apparatus of claim 18, wherein the pad dresser arm comprises a pad dresser head, the pad dresser head having holes therein, the holes coupled to a second suction line.

20. The CMP apparatus of claim 16, wherein the vacuum apparatus has a length between 33% and 88% of a length of the slurry dispenser.

* * * * *